United States Patent
Miya et al.

(10) Patent No.: US 10,598,792 B2
(45) Date of Patent: Mar. 24, 2020

(54) INFORMATION PROCESSING DEVICE AND POSITIONING DEVICE

(71) Applicant: Mitsubishi Electric Corporation, Chiyoda-ku (JP)

(72) Inventors: Masakazu Miya, Tokyo (JP); Seigo Fujita, Tokyo (JP); Yoshihiro Shima, Tokyo (JP); Hisao Sone, Tokyo (JP); Ryoichiro Yasumitsu, Tokyo (JP); Natsuki Kondo, Tokyo (JP); Tsutomu Nakajima, Tokyo (JP); Kazuhiro Terao, Tokyo (JP); Masayuki Saito, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 267 days.

(21) Appl. No.: 15/527,224

(22) PCT Filed: Nov. 26, 2015

(86) PCT No.: PCT/JP2015/083293
§ 371 (c)(1),
(2) Date: May 16, 2017

(87) PCT Pub. No.: WO2016/088654
PCT Pub. Date: Jun. 9, 2016

(65) Prior Publication Data
US 2017/0363744 A1    Dec. 21, 2017

(30) Foreign Application Priority Data

Dec. 2, 2014    (JP) ................................. 2014-243765

(51) Int. Cl.
*G01S 19/07*    (2010.01)
*G01S 19/08*    (2010.01)
(Continued)

(52) U.S. Cl.
CPC .............. *G01S 19/07* (2013.01); *G01S 19/08* (2013.01); *G01S 19/20* (2013.01); *G01S 19/28* (2013.01); *H03M 7/30* (2013.01)

(58) Field of Classification Search
CPC .......... G01S 19/07; G01S 19/08; G01S 19/20; G01S 19/28; H03M 7/30
(Continued)

(56) References Cited

U.S. PATENT DOCUMENTS

| 5,323,163 A | 6/1994 | Maki |
| 5,990,825 A | 11/1999 | Ito |

(Continued)

FOREIGN PATENT DOCUMENTS

| AU | 2011-360286 A1 | 9/2013 |
| AU | 2011-360286 B2 | 5/2015 |

(Continued)

OTHER PUBLICATIONS

Examination Report No. 1 dated Jan. 19, 2018 in Australian Patent Application No. 2015356145, 4 pages.
(Continued)

Primary Examiner — Harry K Liu
(74) Attorney, Agent, or Firm — Oblon, McClelland, Maier & Neustadt, L.L.P.

(57) ABSTRACT

An augmentation information adjustment unit (102) reduces an amount of information in augmentation information by combining: update cycle adjustment processing (1021) to set an update cycle of the augmentation information to be an integer multiple of a predetermined update cycle; geographic interval error value adjustment processing (1022) to reduce the number of geographic interval error values by selecting from among a plurality of the geographic interval error values each of which is an error at every predetermined geographic interval out of a plurality of error values, a (Continued)

geographic interval error value at every geographic interval that is an integer multiple of the predetermined geographic interval; and bit count adjustment processing (1023) to reduce a bit count of the error value for each error value. An augmentation information output unit (103) outputs, to an output destination, augmentation information after being reduced in the amount of information by the augmentation information adjustment unit (102).

12 Claims, 19 Drawing Sheets

(51) Int. Cl.
    *H03M 7/30*     (2006.01)
    *G01S 19/28*     (2010.01)
    *G01S 19/20*     (2010.01)

(58) Field of Classification Search
    USPC .................................................. 342/357.44
    See application file for complete search history.

(56) References Cited

U.S. PATENT DOCUMENTS

| | | | |
|---|---|---|---|
| 6,324,473 | B1 | 11/2001 | Eschenbach |
| 6,529,830 | B1 | 3/2003 | Eschenbach |
| 6,704,652 | B2 | 3/2004 | Yi |
| 6,741,935 | B1 | 5/2004 | Eschenbach |
| 7,423,582 | B2 | 9/2008 | Holderle et al. |
| 8,174,439 | B2 | 5/2012 | Torimoto et al. |
| 8,400,352 | B2 | 3/2013 | Fenton |
| 2002/0111717 | A1 | 8/2002 | Scherzinger |
| 2006/0089155 | A1 | 4/2006 | Hayashi |
| 2006/0132358 | A1 | 6/2006 | Holderle et al. |
| 2010/0079333 | A1 | 4/2010 | Janky |
| 2010/0141515 | A1 | 6/2010 | Doucet et al. |
| 2010/0290504 | A1 | 11/2010 | Torimoto et al. |
| 2011/0032147 | A1 | 2/2011 | Venkatraman |
| 2011/0090116 | A1 | 4/2011 | Hatch et al. |
| 2011/0102254 | A1 | 5/2011 | Fenton |
| 2012/0232724 | A1 | 9/2012 | Janky et al. |
| 2012/0286991 | A1 | 11/2012 | Chen |
| 2013/0088385 | A1* | 4/2013 | Charlot .................. G01S 19/02 342/357.44 |
| 2014/0070992 | A1* | 3/2014 | Hernandez-Pajares ..................... G01S 19/44 342/357.395 |
| 2014/0180580 | A1 | 6/2014 | Zou |
| 2014/0292573 | A1 | 10/2014 | Drescher |
| 2014/0347219 | A1* | 11/2014 | Gou ........................ G01S 19/33 342/357.63 |
| 2015/0369924 | A1* | 12/2015 | Hedgecock ............. G01S 19/51 342/357.34 |

FOREIGN PATENT DOCUMENTS

| | | |
|---|---|---|
| JP | 10-048320 A | 2/1998 |
| JP | 2000-081476 A | 3/2000 |
| JP | 2001-143200 A | 5/2001 |
| JP | 2003-187395 A | 7/2003 |
| JP | 2003-344524 A | 12/2003 |
| JP | 2004-125667 A | 4/2004 |
| JP | 2004-138562 A | 5/2004 |
| JP | 2006-132949 A | 5/2005 |
| JP | 2006-125867 A | 5/2006 |
| JP | 2007-093513 A | 4/2007 |
| JP | 2007-171082 A | 7/2007 |
| JP | 2008-524596 A | 7/2008 |
| JP | 2009-257802 A | 11/2009 |
| JP | 2010-112725 A | 5/2010 |
| JP | 2011-112576 A | 6/2011 |
| JP | 2011-179894 A | 9/2011 |
| JP | 2012-085202 A | 4/2012 |
| JP | 2013-083532 A | 5/2013 |
| JP | 2013-130395 A | 7/2013 |
| JP | 2014-016315 A | 1/2014 |
| JP | 2014-037993 A | 2/2014 |
| JP | 5523575 B | 6/2014 |
| JP | 2014-153087 A | 8/2014 |
| JP | 2014-206502 A | 10/2014 |
| JP | 2015-001426 A | 1/2015 |
| OA | 9803 A | 4/1994 |
| WO | WO 2006/086071 | 8/2006 |
| WO | 2009/044819 A1 | 4/2009 |
| WO | 2012/114620 A1 | 8/2012 |
| WO | WO 2012/128125 A1 | 9/2012 |

OTHER PUBLICATIONS

International Search Report dated Feb. 23, 2016 in PCT/JP2015/083293, filed Nov. 26, 2015.
International Search Report dated Feb. 2, 2016 in PCT/JP2015/080657, filed Oct. 30, 2015.
Extended European Search Report dated Jun. 13, 2018 in Patent Application No. 15854727.3, 9 pages.
Extended European Search Report dated Jan. 23, 2018 in European Patent Application No. 17167756.0, 10 pages.
Masayuki Saito, et al., "Centimeter-class Augmentation System Utilizing Quasi-Zenith Satellite System", GNSS 2011—Proceedings on the 24th International Technical Meeting of the Satellite Division of the Institute of Navigation (ION GNSS 2011), XP056000869, Sep. 23, 2011, pp. 1243-1253.
Per Enge, et al., "Wide Area Augmentation of the Global Positioning System", Proceeding of the IEEE, vol. 84 No. 8, XP011043736, Aug. 1, 1996, pp. 1063-1088.
U.S. Appl. No. 15/518,497, filed Apr. 12, 2017, Masayuki Saito, et al.
U.S. Appl. No. 15/610,249, filed May 31, 2017, Masayuki Saito et al.
Office Action dated Feb. 5, 2019 in Japanese Patent Application No. 2018-029256, 6 pages (with unedited computer generated English translation).
Sakai, T. et al. "Augmentation Signal Structure for QZSS Satellite Navigation System", IEICE Technical Report, vol. 104, No. 237, 2004, 11 pages (with English Abstract).
Office Action dated Mar. 29, 2018 in Australian Patent Application No. 2017202266.
Japanese Office Action dated Oct. 10, 2017 in Japanese Patent Application No. 2016-562411 (with English translation).
Makiko Murakami, et al., "High Accuracy Navigation Service using Quasi-Zenith Satellite System", Institute of Electrical Engineers of Japan industrial system information-ized study group data, Institute of Electrical Engineers of Japan, vol. IIS-03 No. 24-33, May 23, 2003, pp. 29-32 (with English abstract).
Extended European Search Report dated Apr. 8, 2019 in European Patent Application No. 18215394.0, 9 pages.
Japanese Office Action dated Jul. 11, 2017 in Japanese Patent Application No. 2016-197118 (with partial English translation).
Office Action dated Sep. 10, 2019 in Japanese Patent Application No. 2018-029256 (with unedited computer generated English translation).
Office Action dated May 28, 2019 in co-pending U.S. Appl. No. 15/518,497 Armand, M. Anthony.
Office Action dated Jun. 24, 2019 in co-pending U.S. Appl. No. 15/610,249, 26 pages.
Office Action dated Dec. 31, 2019 in co-pending U.S. Appl. No. 15/518,497, 31 pages.
Office Action dated Dec. 31, 2019 in co-pending U.S. Appl. No. 15/610,249, 23 pages.

* cited by examiner

Fig. 11

| No | COMPONENT | DESCRIPTION |
|---|---|---|
| 601 | APPROXIMATE POSITION/SATELLITE POSITION CALCULATION UNIT | CALCULATE APPROXIMATE POSITION OF POSITIONING POINT AND POSITION OF EACH SATELLITE |
| 602 | CORRECTION DATA GENERATION UNIT | GENERATE CORRECTION DATA FROM AUGMENTATION INFORMATION, APPROXIMATE POSITION, AND SATELLITE POSITION |
| 603 | OBSERVED DATA SCREENING UNIT | ELIMINATE OBSERVED DATA EXPECTED TO BE DEGRADED IN QUALITY |
| 604 | OBSERVED DATA ERROR CORRECTION UNIT | CALCULATE DOUBLE DIFFERENCE DATA OF OBSERVED DATA |
| 605 | TIME EXTRAPOLATION CALCULATION UNIT | ESTIMATE STATE QUANTITY $X(t)$ AT CURRENT TIME FROM STATE QUANTITY $\hat{X}(t-\Delta t)$ AT PREVIOUS TIME $\hat{X}(t-\Delta t) = \Phi \cdot X(t)$ |
| 606 | GEOMETRIC DISTANCE CALCULATION UNIT | CALCULATE GEOMETRIC DISTANCE |
| 607 | RESIDUAL CALCULATION UNIT | CALCULATE DOUBLE DIFFERENCE RESIDUAL FROM DOUBLE DIFFERENCE DATA AND GEOMETRIC DISTANCE |
| 608 | OBSERVATION UPDATE CALCULATION UNIT | UPDATE STATE QUANTITY SUCH THAT STATE QUANTITY HAS SMALLEST ESTIMATED ERROR |
| 610 | CARRIER SMOOTHING PROCESSING | PERFORM CARRIER SMOOTHING ON PSEUDORANGE |
| 611 | PROCESS NOISE ADJUSTMENT UNIT | CALCULATE PROCESS NOISE ACCORDING TO TYPE OF MOVING BODY |
| 612 | OBSERVATION NOISE CALCULATION UNIT | CALCULATE OBSERVATION NOISE BY USING INTEGRITY INFORMATION |

Fig. 12

| No | INTERMEDIATE DATA | DESCRIPTION |
|---|---|---|
| 151 | APPROXIMATE POSITION | POSITION OF POSITIONING POINT THAT IS CALCULATED BY INDEPENDENT POSITIONING AND ACCURATE ON THE ORDER OF METERS |
| 152 | SATELLITE POSITION | POSITION OF EACH SATELLITE TRANSMITTING OBSERVED DATA |
| 153 | CORRECTION DATA | ERROR EXPECTED TO BE INCLUDED IN OBSERVED DATA RECEIVED AT POSITIONING POINT FROM EACH SATELLITE |
| 154 | DOUBLE DIFFERENCE DATA | AMOUNT OBTAINED BY SUBTRACTING OBSERVED DATA OF MASTER SATELLITE FROM OBSERVED DATA OF SLAVE SATELLITE |
| 155 | GEOMETRIC DISTANCE | DISTANCE BETWEEN POSITIONING POINT AND SATELLITE CALCULATED FROM POSITION OF POSITIONING POINT AND SATELLITE POSITION |
| 156 | DOUBLE DIFFERENCE RESIDUAL | DOUBLE DIFFERENCE AMOUNT CALCULATED BY RESIDUAL (i) = DOUBLE DIFFERENCE DATA - STATE QUANTITY |

Fig. 13

THRESHOLD TABLE

| RANGE OF ANGLE OF ELEVATION (DEGREES) | THRESHOLD OF RECEIVED SIGNAL STRENGTH (dB) |
|---|---|
| 10-20 | 36 |
| 20-30 | 40 |
| 30-40 | 42 |
| 40-50 | 45 |
| 50-60 | 48 |
| ... | ... |

Fig. 15

| SYMBOL | NAME | DESCRIPTION | SUPPLEMENTAL INFORMATION |
|---|---|---|---|
| x | STATE QUANTITY VECTOR | QUANTITY ESTIMATING POSITION AND SPEED | (−) INDICATES PREVIOUS EPOCH, AND (+) INDICATES CURRENT EPOCH |
| P | ERROR COVARIANCE MATRIX | COVARIANCE MATRIX OF ESTIMATED ERROR OF STATE QUANTITY | NO HAT/HAT INDICATE BEFORE/AFTER OBSERVATION IS UPDATED |
| Q | PROCESS NOISE MATRIX | ERROR IN DYNAMIC MODEL | DESIGN VALUE |
| Φ | TRANSITION MATRIX | MATRIX REPRESENTING TEMPORAL TRANSITION OF STATE QUANTITY | DETERMINED BY DYNAMIC MODEL ADOPTED |
| y | OBSERVATION AMOUNT VECTOR | OBSERVED DATA = GPS SIGNAL | |
| R | OBSERVATION NOISE MATRIX | MATRIX REPRESENTING NOISE IN OBSERVED DATA | DESIGN VALUE |
| H | OBSERVATION MATRIX | MATRIX REPRESENTING RELATIONSHIP BETWEEN STATE QUANTITY AND OBSERVATION AMOUNT | DETERMINED BY OBSERVATION MODEL ADOPTED | ns
INFORMATION PROCESSING DEVICE AND POSITIONING DEVICE

TECHNICAL FIELD

The present invention relates to satellite positioning.

BACKGROUND ART

In order to receive positioning information and positioning augmentation information that are broadcast from various positioning satellites such as a quasi-zenith satellite of Japan and a GPS (Global Positioning System) satellite of the United States, it is essential that a satellite is visible. Conventionally, positioning using information from a positioning satellite cannot be performed in the indoors where the satellite is not visible. Further, it is also difficult to use a positioning satellite in a boundary area in moving from the indoors to the outdoors or from the outdoors to the indoors due to the effect of a roadside tree, the effect of multipath and the like on a signal from the positioning satellite, and also because it takes time to re-acquire the signal.

Further, various schemes of positioning techniques in the outdoors or positioning techniques in the indoors have been proposed, and commercialization of some of the schemes is being promoted (for example, see Patent Literature 1).

In an independent positioning scheme in which a positioning device independently determines a position by using code information of a GNSS signal from a satellite positioning system (GNSS: Global Navigation System) such as a GPS, GALILEO, GLONASS, or quasi-zenith satellite system, an error included in the GNSS signal results in positioning accuracy on the order of meters.

Compared to the independent positioning scheme, a positioning scheme using augmentation information realizes high accuracy positioning on the order of centimeters.

This positioning scheme uses observed data at an electronic reference point or the like, the accurate coordinates of which are known, to estimate an error arising from a positioning satellite and an error arising from an atmospheric state for each positioning satellite and provide an amount of error correction as the augmentation information to a positioning device.

The augmentation information is transmitted from a quasi-zenith satellite or a wireless LAN (Local Area Network) network, for example, to be provided to the positioning device.

The positioning device performs error correction on a positioning signal by using the amount of error correction in the augmentation information to thus be able to realize high accuracy positioning on the order of centimeters.

A technique disclosed in Patent Literature 2 relates to the high accuracy positioning using the augmentation information, for example.

CITATION LIST

Patent Literature

Patent Literature 1: WO 2009/044819 A1
Patent Literature 2: JP 2014-16315 A

SUMMARY OF INVENTION

Technical Problem

It is necessary to use augmentation information on the order of centimeters in order to realize satellite positioning with high accuracy.

On the other hand, in order to transmit the augmentation information on the order of centimeters, a communication bandwidth of as much as several Mbps (bits per second) is required with a scheme using a cellular phone line or a wireless LAN network, and a communication bandwidth of as much as several Kbps is required with a scheme using a satellite line, for example.

The cellular phone line, the wireless LAN network, or the satellite transmits information used in various services in addition to the augmentation information, where there is a problem that transmission of the augmentation information constrains a communication bandwidth used for other information.

Moreover, when the positioning device cannot use the augmentation information on the order of centimeters in the boundary area between the outdoors and the indoors, it is difficult to link the outdoors and the boundary area as well as the boundary area and the indoors seamlessly (without disruption of positioning information) to perform positioning with high accuracy which is higher than an accuracy on the order of meters.

It is one of the main objects of the present invention to solve the aforementioned problems, and it is an object to achieve high accuracy positioning without constraining the communication bandwidth even in a boundary area between the outdoors and the indoors.

Solution to Problem

An information processing device according to the present invention includes: an augmentation information adjustment unit to convert, according to a communication channel, a format for representing augmentation information which is updated in a predetermined update cycle, includes a plurality of error values, and is used to correct a satellite positioning error; and an augmentation information output unit to output the augmentation information after being converted by the augmentation information adjustment unit.

Advantageous Effects of Invention

According to the present invention, the communication bandwidth can be used effectively by converting a format for representing augmentation information according to a communication channel being used.

Moreover, according to the present invention, the augmentation information is manipulated to realize high accuracy positioning, so that relatively high positioning accuracy can be maintained.

BRIEF DESCRIPTION OF DRAWINGS

FIG. 11 is a table illustrating components of the positioning device according to the third embodiment.

FIG. 12 is a table illustrating intermediate data of the positioning device according to the third embodiment.

FIG. 13 is a table illustrating an example of a threshold table according to the third embodiment.

FIG. 15 is a table illustrating a vector and a matrix used in the Kalman filter according to the third embodiment.

DESCRIPTION OF EMBODIMENTS

First Embodiment

*Description of Configuration*

Figure 1:
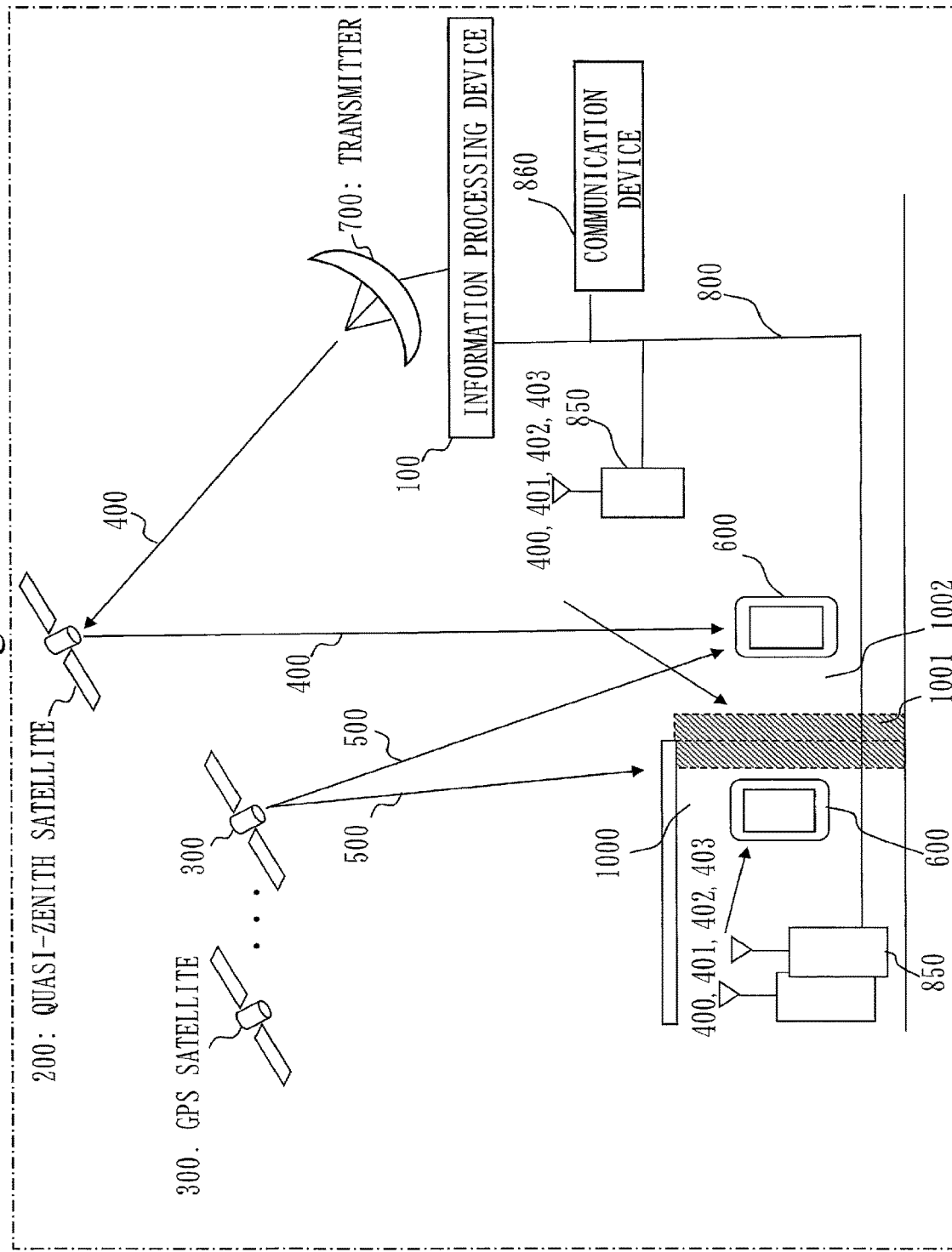
FIG. 1 is a diagram illustrating a configuration example of a positioning system according to a first embodiment.

FIG. 1 is a diagram illustrating a configuration example of a positioning system according to the present embodiment.

An information processing device 100 in FIG. 1 generates augmentation information on the order of centimeters and degrades the generated augmentation information on the order of centimeters to generate augmentation information on the order of decimeters 400. Then, the information processing device 100 transmits the generated augmentation information on the order of decimeters 400 using a communication channel. The communication channel is a wired or wireless communication line which is used to transmit the augmentation information on the order of decimeters 400. Specifically, the information processing device 100 transmits the augmentation information on the order of decimeters 400 to a positioning device 600 using a communication channel which is a wireless LAN network 800. The information processing device 100 also transmits the augmentation information on the order of decimeters 400 to a quasi-zenith satellite 200 using a communication channel which is a wireless communication network.

The information processing device 100 then generates additional information 401, miscellaneous information 402, and positioning information 403. The information processing device 100 is connected to the wireless LAN network 800. Relay communication equipment 850 is connected to the wireless LAN network 800.

The information processing device 100 provides the augmentation information on the order of decimeters 400, the additional information 401, and the miscellaneous information 402 to the wireless LAN network 800.

The information processing device 100 provides the positioning information 403 to the wireless LAN network 800.

The information processing device 100 provides the augmentation information on the order of decimeters 400 to the quasi-zenith satellite 200 to be described later.

The relay communication equipment 850 transmits, to the positioning device 600 by wireless LAN communication, the augmentation information on the order of decimeters 400, the additional information 401, and the miscellaneous information 402 that are provided via the wireless LAN network 800.

The relay communication equipment 850 also transmits, to the positioning device 600 by wireless LAN communication, the positioning information 403 that is provided via the wireless LAN network 800.

Using various types of communication schemes such as WiFi provided on the ground, the relay communication equipment 850 distributes, to a boundary area 1001 between indoors 1000 and outdoors 1002, the additional information 401, the miscellaneous information 402, and the positioning information 403 that are associated with the boundary area 1001 being an underground shopping center, an underground parking lot, a building, an inlet and outlet of a road tunnel or the like, a sidewalk or the like adjacent to a building, and so on. By this distribution, seamless positioning can be realized in the outdoors and the boundary area 1001.

Note that the additional information 401 is composed of various types of positioning information such as ephemeris information, availability, integrity, and continuity as well as security information for authentication, privacy protection, user management, and the like, for example. The ephemeris information is used to shorten TTFF (The Time To First Fix: initial position calculation time) which is the initial time for the positioning device 600 to perform positioning after acquiring a GPS satellite 300.

The miscellaneous information 402 is composed of point cloud data (data of a point cloud represented by a set of three-dimensional coordinate points, and generated by measuring the surface of a three-dimensional object such a building, a structure, or a growing object with a three-dimensional scanner such as a stereo camera, a three-dimensional laser measurement device, or a mobile mapping system), three-dimensional high-accuracy position information such as feature data, open data concerning a public institution such as bus and railway information, application usage information concerning people and goods by various business operators (application information), information related to positioning accuracy status around a user, and so on.

In ground-based communication using the relay communication equipment 850, communication schemes having a nominal transmission rate on the order of megabytes or gigabytes, such as WiFi and Bluetooth (registered trademark), are widely used, and the nominal transmission rate is expected to be increased further in the future. By using and applying the transmission rate, it is possible to simultaneously distribute not only positioning information and the augmentation information on the order of decimeters 400 but also the additional information 401 including security information as well as the miscellaneous information 402 composed of various types of information such as map, vehicle, and railway information to meet the needs of a user of a user application.

The augmentation information on the order of centimeters is a piece of information used to correct a satellite positioning error that occurs in independent positioning using a positioning signal from a GPS satellite, and is a piece of augmentation information by which positioning accuracy on the order of centimeters is achieved as positioning accuracy after the correction.

The positioning accuracy on the order of centimeters means that the positioning error falls within the order of two to three centimeters with a probability of 65% or higher.

On the other hand, the augmentation information on the order of decimeters is a piece of information used to correct the positioning error that occurs in independent positioning using the positioning signal from the GPS satellite, and is a piece of augmentation information by which positioning accuracy on the order of decimeters is achieved as the positioning accuracy after the correction.

The positioning accuracy on the order of decimeters means that the positioning error falls within the order of 20 to 30 centimeters with a probability of 65% or higher.

The positioning information 403 is composed of position information of the relay communication equipment 850 and a positioning signal of the same type as a positioning signal 500 from the GPS satellite 300 to be described later.

The quasi-zenith satellite 200 receives augmentation information on the order of decimeters 400 obtained by the information processing device 100 from a transmitter 700, and transmits the received augmentation information on the order of decimeters 400 to the earth.

The quasi-zenith satellite 200 transmits the augmentation information on the order of decimeters 400 at any one of frequencies L1, L2, and L5, for example. Note that while the present embodiment describes an example of transmitting the augmentation infounation on the order of decimeters 400 from the quasi-zenith satellite 200, the augmentation information on the order of decimeters 400 may instead be transmitted from a satellite other than the quasi-zenith satellite 200, or may be transmitted from a cellular phone line or the wireless LAN network 800 providing a wireless LAN environment.

The GPS satellite 300 being a positioning satellite transmits the positioning signal 500.

A GNSS satellite such as GLONASS, Galileo, BeiDou, or the quasi-zenith satellite 200 may be used instead of the GPS satellite 300.

Moreover, the GPS satellite 300 may be adapted to transmit the augmentation information on the order of decimeters 400.

The positioning signal 500 includes observed data 501 and a broadcast ephemeris 502.

A pseudorange between a positioning point and the GPS satellite 300 as well as a carrier phase can be derived from the observed data 501.

Each of the pseudorange and the carrier phase derived from the observed data 501 includes an error.

A positioning device 600 uses the augmentation information on the order of decimeters 400 to eliminate the error included in each of the pseudorange and the carrier phase.

The broadcast ephemeris 502 is a piece of data notifying of an accurate satellite orbit of the GPS satellite 300 from which the broadcast ephemeris 502 is transmitted, and is also called an ephemeris.

The positioning device 600 can be a smart phone, a cellular phone, a tablet terminal, or a car navigation system, for example.

The positioning device 600 receives the positioning signal 500 transmitted from the GPS satellite 300.

The positioning device 600 also receives the augmentation information on the order of decimeters 400 transmitted from the quasi-zenith satellite 200 or the wireless LAN network 800.

When receiving the augmentation information on the order of decimeters 400 from the quasi-zenith satellite 200, the positioning device 600 needs to support any one of the frequencies L1, L2, and L5.

The positioning device 600 applies the augmentation information on the order of decimeters 400 to the positioning signal 500 (including a positioning error on the order of meters) to be able to obtain a positioning result with positioning accuracy on the order of decimeters.

The transmitter 700 transmits the augmentation information on the order of decimeters 400 generated by the information processing device 100 to the quasi-zenith satellite 200.

Now, there will be described an error value included in the augmentation information on the order of centimeters.

The augmentation information on the order of centimeters includes a value of a satellite clock error (hereinafter simply referred to as a satellite clock error), a value of a satellite orbit error (hereinafter simply referred to as a satellite orbit error), an inter-frequency bias, a value of an ionospheric delay error (hereinafter simply referred to as an ionospheric delay error), and a value of a tropospheric delay error (hereinafter simply referred to as a tropospheric delay error).

The satellite clock error, the satellite orbit error, and the inter-frequency bias are errors independent of a region.

The ionospheric delay error and the tropospheric delay error are errors dependent on a region and are calculated for each grid point.

Figure 2:
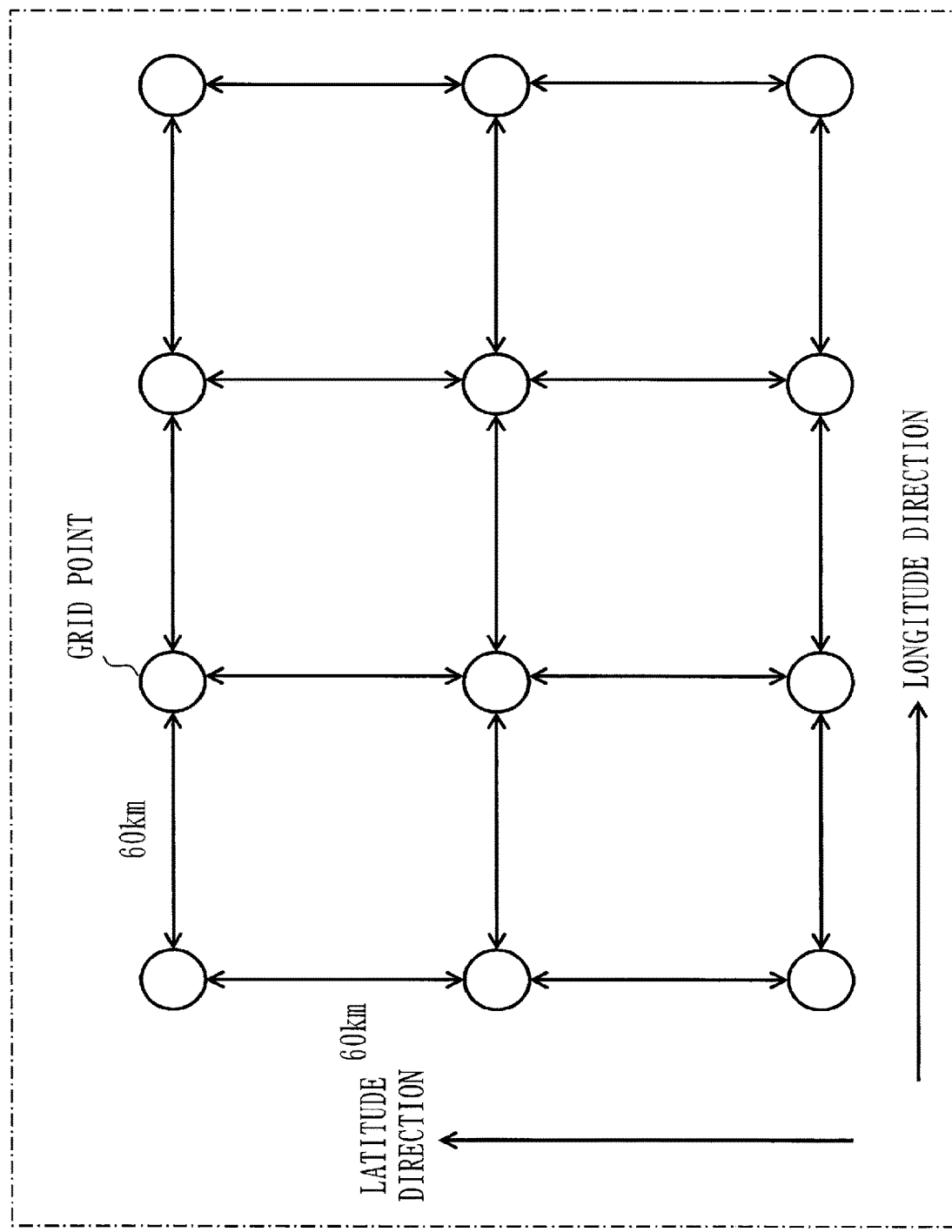
FIG. 2 is a diagram illustrating a grid point according to the first embodiment.

The grid point is a virtual measurement point arranged at approximately 60-km intervals in each of a latitude direction and a longitude direction as illustrated in FIG. 2.

The ionospheric delay error and the tropospheric delay error correspond to a geographic interval error value to be described later.

Note that the augmentation information on the order of centimeters is updated in a predetermined update cycle (specifically, the satellite clock error is updated in a cycle of five seconds, while the other errors being the satellite orbit error, the inter-frequency bias, the ionospheric delay error and the tropospheric delay error are updated in a cycle of 30 seconds).

Figure 3:
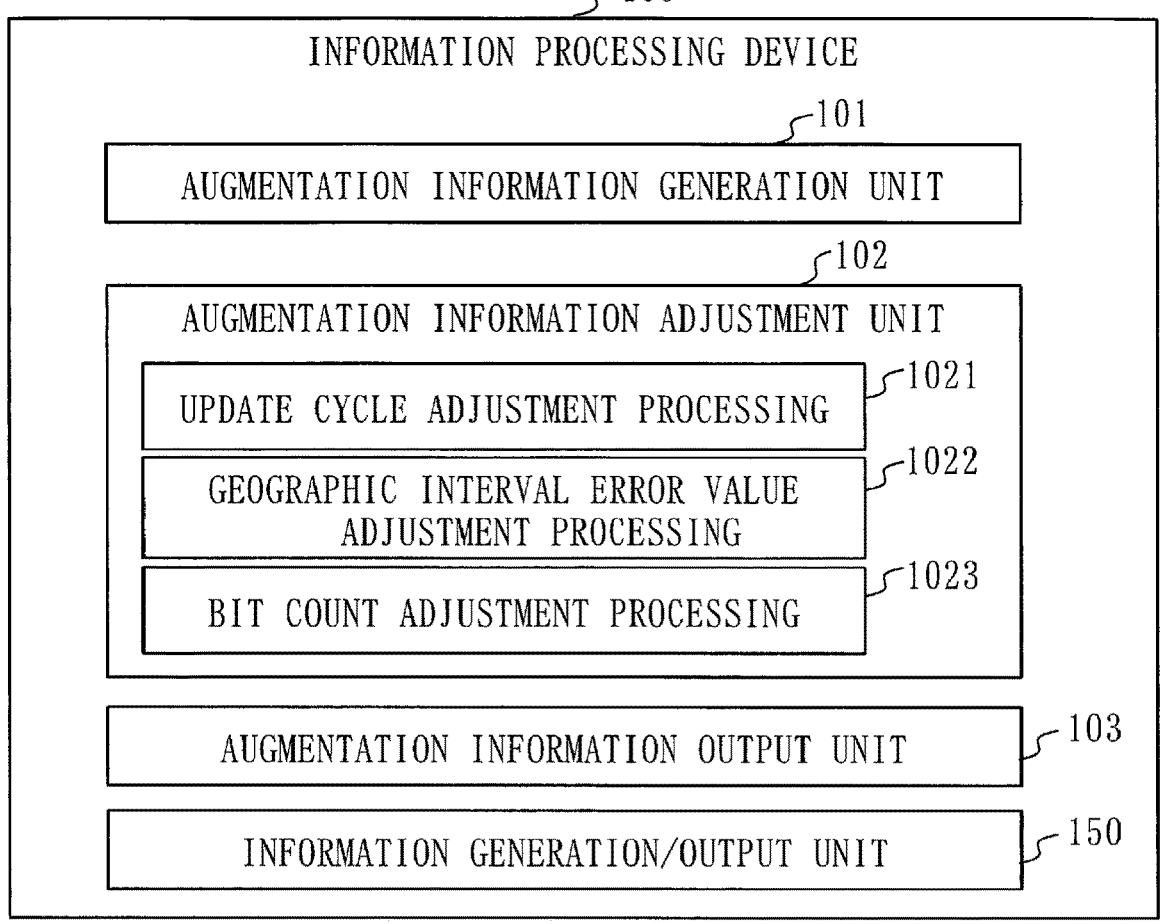
FIG. 3 is a diagram illustrating a configuration example of an information processing device according to the first embodiment.

FIG. 3 is a diagram illustrating a configuration example of the information processing device 100 according to the present embodiment.

An augmentation information generation unit 101 in FIG. 3 generates the augmentation information on the order of centimeters.

The augmentation information generation unit 101 may generate the augmentation information on the order of centimeters by an arbitrary method.

An augmentation information adjustment unit 102 changes a method of representing the augmentation information on the order of centimeters generated by the augmentation information generation unit 101 to generate the augmentation information on the order of decimeters.

More specifically, the augmentation information adjustment unit 102 reduces the amount of information in the augmentation information on the order of centimeters by combining update cycle adjustment processing 1021, geographic interval error value adjustment processing 1022, and bit count adjustment processing 1023.

The update cycle adjustment processing 1021 is processing that sets the update cycle of the augmentation information on the order of centimeters to be an integer multiple of the predetermined update cycle.

In the present embodiment, as an example of the update cycle adjustment processing 1021, there will be described processing that sets the update cycle of the augmentation information on the order of centimeters to a cycle of 60 seconds being twice the original cycle of 30 seconds.

The geographic interval error value adjustment processing 1022 is processing that reduces the number of geographic interval error values by selecting the geographic interval error value every geographic interval being an integer multiple of a predetermined geographic interval from among a plurality of geographic interval error values that is an error in the every predetermined geographic interval.

In the present embodiment, as an example of the geographic interval error value adjustment processing 1022, there will be described processing that reduces the number of each of the ionospheric delay errors and the tropospheric delay errors by extracting the ionospheric delay error and the tropospheric delay error every 180 km being three times as long as 60 km that is the grid point interval in each of the latitude direction and the longitude direction.

The bit count adjustment processing 1023 is processing that reduces a bit count of the error value for each error value.

In the present embodiment, as an example of the bit count adjustment processing 1023 to convert a format for representing (amount of information in) the augmentation information according to the type of a communication channel, there will be described processing that reduces the bit count, for each error value relevant to the carrier wave, starting from the least significant bit, such that the bit count after reduction is equal to any bit count between 60% and 80% of the bit count before the reduction.

An augmentation information output unit 103 outputs, to an output destination, the augmentation information on the order of decimeters 400 being the augmentation information after the amount of information is reduced.

The output destination of the augmentation information output unit 103 is an interface of the transmitter 700 or an interface of the wireless LAN network 800, for example.

Figure 20:
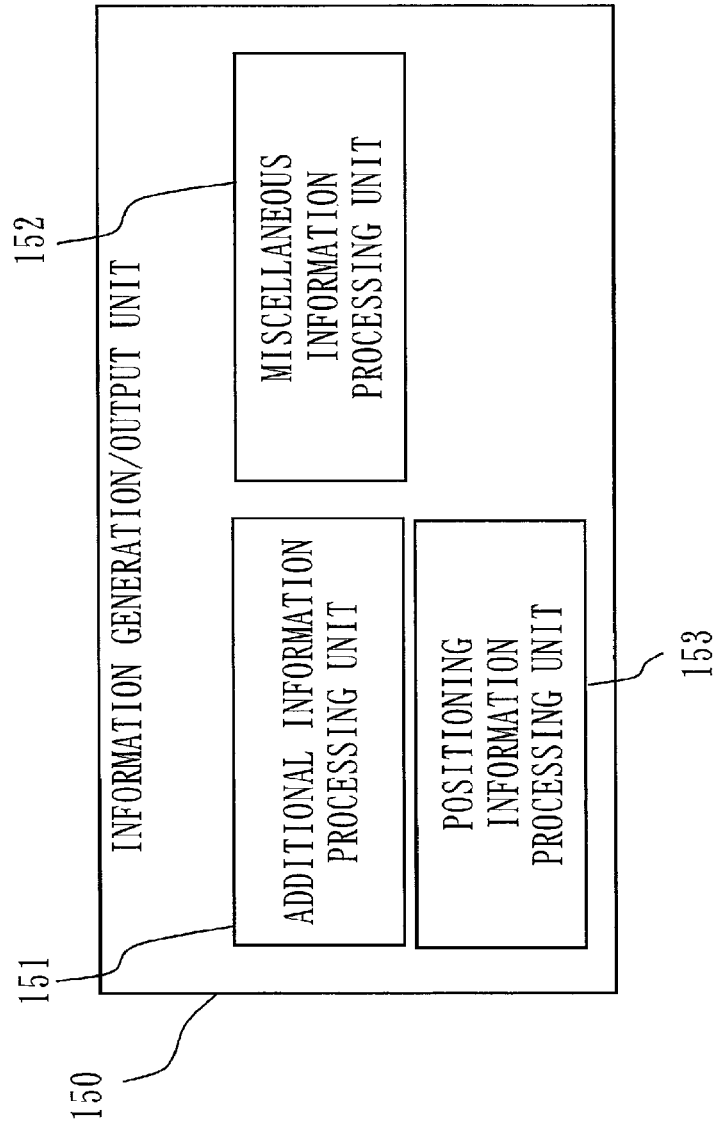
FIG. 20 is a diagram describing a configuration of an information generation/output unit according to the first embodiment.

An information generation/output unit 150 generates the additional information 401, the miscellaneous information 402, and the positioning information 403. FIG. 20 illustrates a configuration of the information generation/output unit 150.

The information generation/output unit 150 is composed of an additional information processing unit 151, a miscellaneous information processing unit 152, and a positioning information processing unit 153. The additional information processing unit 151 generates the additional information 401 for each prescribed region or each relay communication equipment 850, and outputs the additional information 401 to an output destination. The miscellaneous information processing unit 152 generates the miscellaneous information 402 for each prescribed region or each relay communication equipment 850, and outputs the miscellaneous information 402 to an output destination. The positioning information processing unit 153 generates the positioning information 403 for each prescribed region or each relay communication equipment 850, and outputs the positioning information 403 to an output destination.

The output destination of each of the additional information processing unit 151, the miscellaneous information processing unit 152, and the positioning information processing unit 153 is the interface of the transmitter 700 or the interface of the wireless LAN network 800, for example.

The additional information processing unit 151 generates the additional information 401 including various types of positioning information and security information, on the basis of information generated by an external agency and transmitted from a communication device 860. The miscellaneous information processing unit 152 generates various types of information such as three-dimensional high-accuracy position information, open data, an application, and information related to positioning accuracy status, on the basis of information generated by various external business operators and transmitted from the communication device 860.

The positioning information processing unit 153 stores position information of the relay communication equipment 850 in advance, and generates the position information of the relay communication equipment 850 as the positioning information 403. The positioning information processing unit 153 also generates the positioning signal 500 as the positioning information 403. Here, by generating the broadcast ephemeris 502 and the observed data 501 virtually at frequencies such as L1, L2, and L5, the positioning signal 500 functions as a pseudolite. The broadcast ephemeris 502 includes the ephemeris of the GPS satellite 300. A pseudorange between the positioning point and the relay communication equipment 850 as well as a carrier phase can be derived from the observed data 501.

\*\*\*Description of Operation\*\*\*

Next, an operational example of the information processing device 100 according to the present embodiment will be described.

Figure 4:
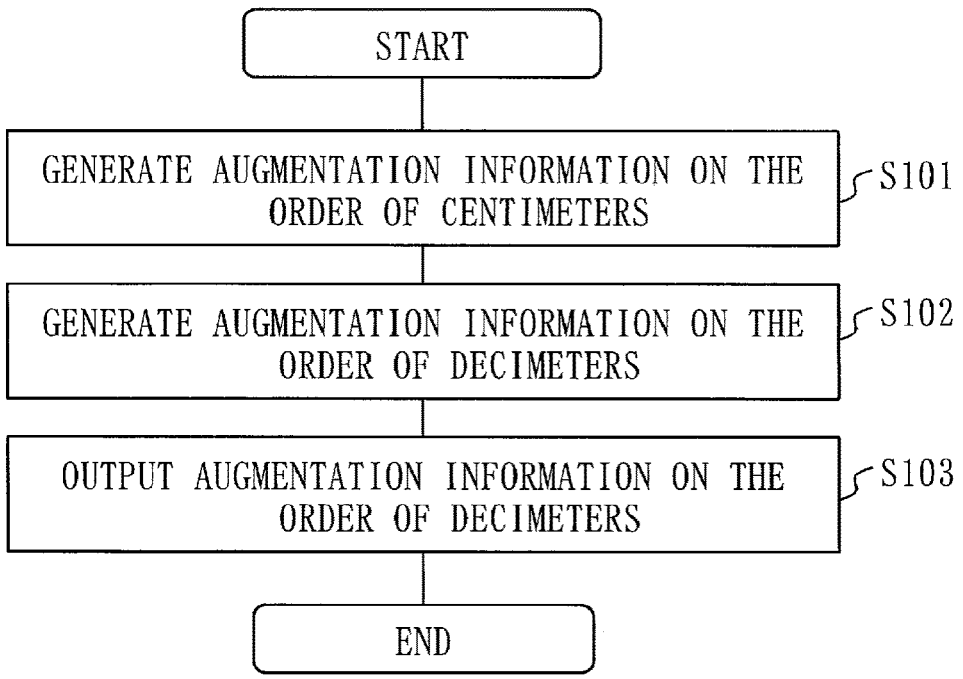
FIG. 4 is a flowchart illustrating an operational example of the information processing device according to the first embodiment.

FIG. 4 is a flowchart illustrating an operational example of the information processing device 100 according to the present embodiment.

First, in step S101, the augmentation information generation unit 101 generates the augmentation information on the order of centimeters.

Then in step S102, the augmentation information adjustment unit 102 degrades the augmentation information on the order of centimeters by converting the format for representing the augmentation information to generate the augmentation information on the order of decimeters.

Finally, in step S103, the augmentation information output unit 103 outputs the augmentation information on the order of decimeters generated by the augmentation information adjustment unit 102 to the output destination.

The output destination of the augmentation information output unit 103 is the interface of the transmitter 700 or the interface of the wireless LAN network 800 as described above, for example.

Next, there will be described in detail the operation in step S102 illustrated in FIG. 4.

Figure 5:
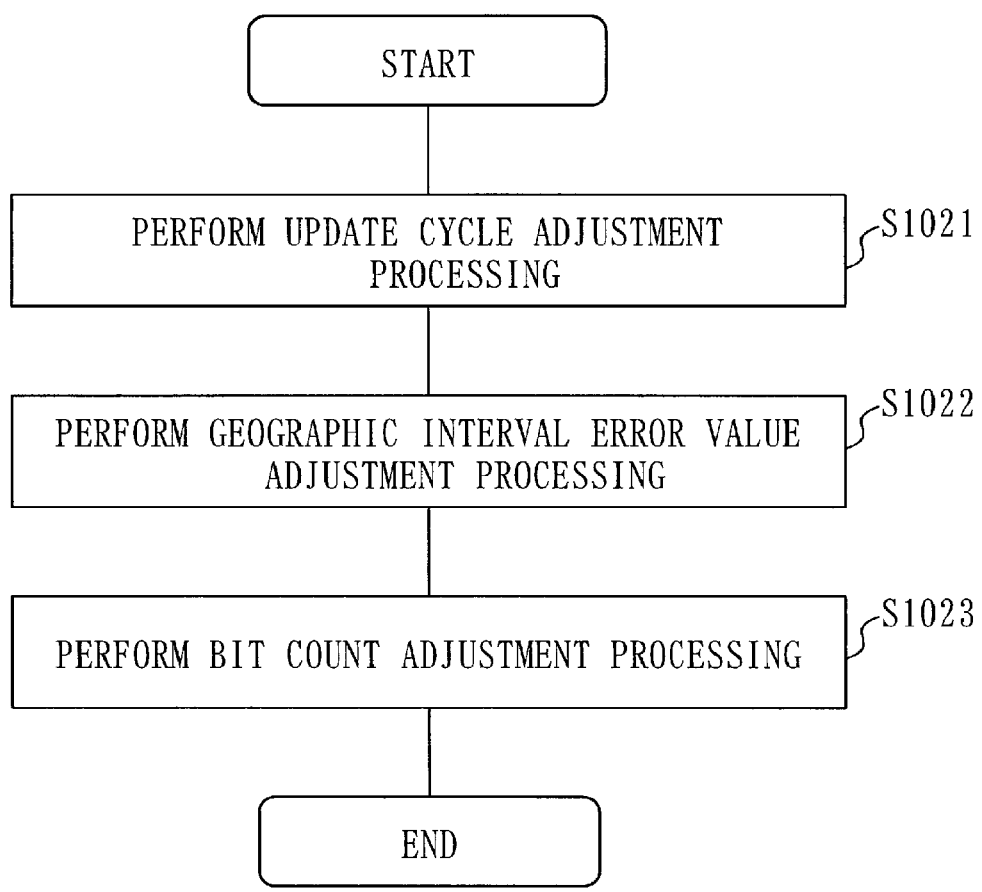
FIG. 5 is a flowchart illustrating an example of processing that generates augmentation information on the order of decimeters, according to the first embodiment.

FIG. 5 is a flowchart illustrating the details of S102.

First, in S1021, the augmentation information adjustment unit 102 performs the update cycle adjustment processing.

The update cycle adjustment processing will be described in detail with reference to FIG. 6.

Figure 6:
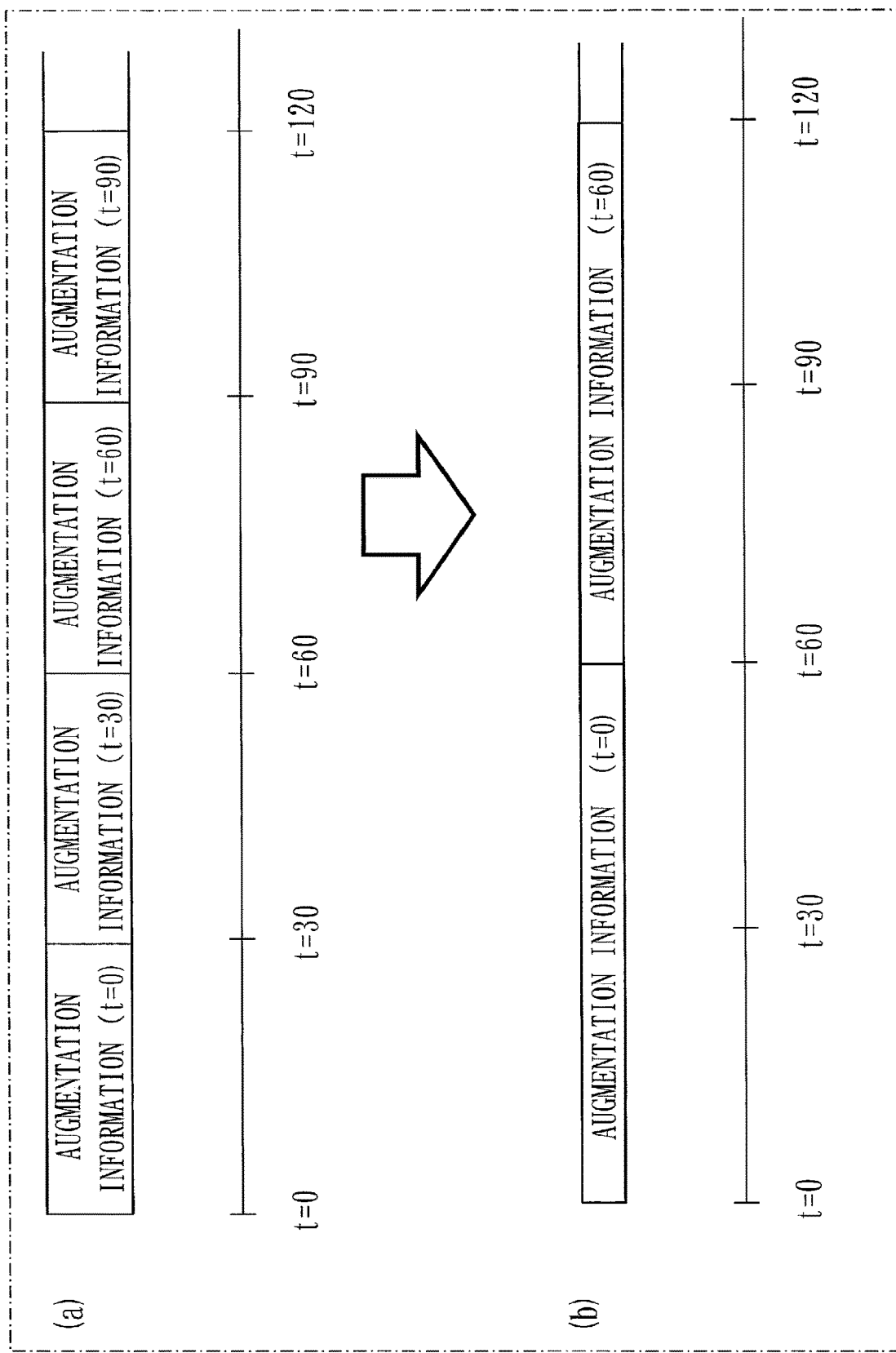
FIG. 6 is a diagram illustrating an example of update cycle adjustment processing according to the first embodiment.

A data stream of the augmentation information on the order of centimeters is illustrated in (a) of FIG. 6.

As illustrated in (a) of FIG. 6, the update cycle of the augmentation information on the order of centimeters is 30 seconds.

Augmentation information (t=0) is the augmentation information on the order of centimeters transmitted from the quasi-zenith satellite 200 or the wireless LAN network 800 between time t=0 and time t=30.

Augmentation information (t=30) is the augmentation information on the order of centimeters transmitted from the quasi-zenith satellite 200 or the wireless LAN network 800 between time t=30 and time t=60.

The same applies to time t=60 onward.

During 30 seconds from time t=0 to time t=30, the satellite clock error, the satellite orbit error, the inter-frequency bias, the ionospheric delay error at each grid point, and the tropospheric delay error at each grid point at a measurement timing T0 (T0<(t=0)) are transmitted as the augmentation information (t=0).

Then, during 30 seconds from time t=30 to time t=60, the satellite clock error, the satellite orbit error, the inter-frequency bias, the ionospheric delay error at each grid point, and the tropospheric delay error at each grid point at a new measurement timing T1 (T1<(t=30)) are transmitted as the augmentation information (t=30).

The same applies to time t=60 onward.

Note that, strictly speaking, the satellite clock error is transmitted five times during 30 seconds since a satellite time error is updated every five seconds, but the augmentation information as a whole is updated in the cycle of 30 seconds.

As illustrated in (a) of FIG. 6, the augmentation information generation unit 101 repeatedly generates the augmentation information on the order of centimeters in increments of 30 seconds and inputs the information to the augmentation information adjustment unit 102.

As illustrated in (b) of FIG. 6, the augmentation information adjustment unit 102 selects the augmentation information on the order of centimeters in increments of 60 seconds.

In an example illustrated in (b) of FIG. 6, the augmentation information adjustment unit 102 selects the augmentation information (t=0) between time t=0 and time t=30, and spends 60 seconds transmitting the augmentation information (t=0).

That is, the augmentation information adjustment unit 102 transmits the augmentation information (t=0) at a rate half the transmission rate in (a) of FIG. 6.

The augmentation information adjustment unit 102 does not select the following augmentation information (t=30) between time t=30 and time t=60.

Moreover, the augmentation information adjustment unit 102 selects the augmentation information (t=60) between time t=60 and time t=90, and spends 60 seconds transmitting the augmentation information (t=60).

That is, the augmentation information adjustment unit 102 transmits the augmentation information (t=60) at a rate half the transmission rate in (a) of FIG. 6.

The augmentation information adjustment unit 102 does not select the following augmentation information (t=90) between time t=90 and time t=120.

Only the augmentation information on the order of centimeters selected in the update cycle adjustment processing (S1021) is subjected to the processing from S1022 onward.

The number of pieces of augmentation information on the order of centimeters to be subjected to the processing in S1022 is reduced by half when the update cycle adjustment processing (S1021) is performed by the method illustrated in (b) of FIG. 6.

Referring back to FIG. 4, the augmentation information adjustment unit 102 performs the geographic interval error value adjustment processing in S1022.

The augmentation information adjustment unit 102 performs the geographic interval error value adjustment processing on each augmentation information on the order of centimeters selected in S1021.

The geographic interval error value adjustment processing will be described in detail with reference to FIG. 7.

Figure 7:
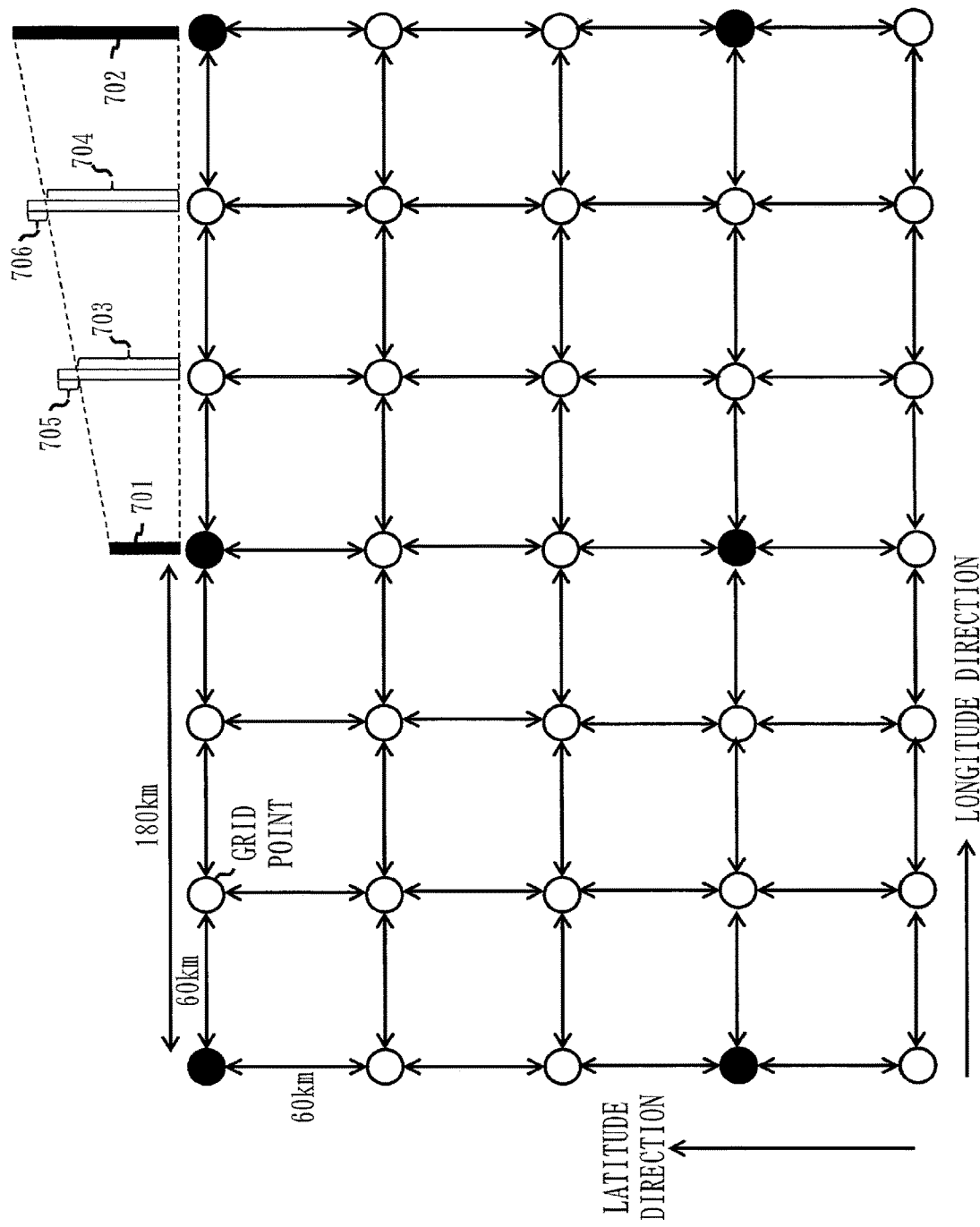
FIG. 7 is a diagram illustrating an example of geographic interval error value adjustment processing according to the first embodiment.

Each point in FIG. 7 indicates the grid point.

The augmentation information on the order of centimeters selected in S1021 each includes the ionospheric delay errors and the tropospheric delay errors of all the grid points.

In S1022, the augmentation information adjustment unit 102 reduces the number of each of the ionospheric delay errors and the tropospheric delay errors by selecting the ionospheric delay error and the tropospheric delay error every three grid points (180 km) in each of the latitude direction and the longitude direction from among the ionospheric delay errors and the tropospheric delay errors of all the grid points included in the augmentation information on the order of centimeters.

As a result of the reduction, only the ionospheric delay error and the tropospheric delay error corresponding to the grid point filled in with black in FIG. 7 are selected to be subjected to the processing in S1023.

The number of each of the ionospheric delay errors and the tropospheric delay errors to be subjected to the processing in S1023 is reduced to one ninth when the geographic interval error value adjustment processing (S1022) is performed by the method illustrated in FIG. 7.

That is, a multiplication of one third in the latitude direction by one third in the longitude direction gives one ninth overall.

Note that a reference numeral 701 and a reference numeral 702 in FIG. 7 indicate the ionospheric delay error and the tropospheric delay error included in the augmentation information on the order of centimeters.

The positioning device 600 can calculate estimated values (a reference numeral 703 and a reference numeral 704) of the ionospheric delay error and the tropospheric delay error at a grid point not included in the augmentation information on the order of centimeters by performing linear interpolation between the ionospheric delay errors and the tropospheric delay errors (the reference numeral 701 and the reference numeral 702) included in the augmentation information on the order of centimeters.

However, actual ionospheric delay errors and tropospheric delay errors can possibly have errors (a reference numeral 705 and a reference numeral 706) with respect to the estimated values (the reference numeral 703 and the reference numeral 704).

The augmentation information adjustment unit 102 notifies of a decrease in reliability caused by the errors (the reference numeral 705 and the reference numeral 706) with respect to the estimated values at the grid points not included in the augmentation information on the order of centimeters in the form of integrity information to be described later.

Referring back to FIG. 5, the augmentation information adjustment unit 102 performs the bit count adjustment processing in S1023.

The bit count adjustment processing will be described in detail with reference to FIG. 8.

Figure 8:
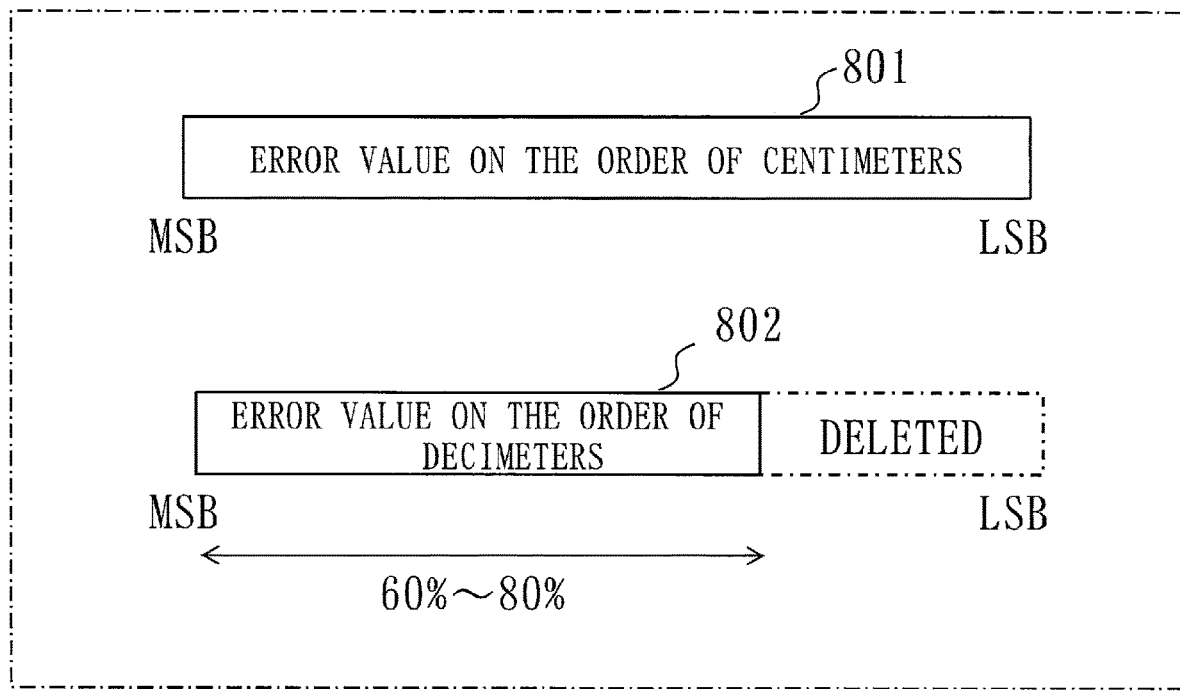
FIG. 8 is a diagram illustrating an example of bit count adjustment processing according to the first embodiment.

In FIG. 8, a reference numeral 801 denotes an error value on the order of centimeters and a reference numeral 802 denotes an error value on the order of decimeters.

The error value on the order of centimeters 801 is each error value included in the augmentation information on the order of centimeters.

The error value on the order of decimeters 802 is an error value obtained after reducing the bit count of the error value on the order of centimeters 801.

In the bit count adjustment processing (S1023), the augmentation information adjustment unit 102 reduces the bit count, for each error value relevant to the carrier wave, starting from the least significant bit (LSB), such that the bit count of the error value on the order of decimeters 802 is equal to any bit count between 60% and 80% of the bit count of the error value on the order of centimeters 801.

When the error value on the order of centimeters 801 has 20 bits, for example, the augmentation information adjustment unit 102 reduces the bit count such that the bit count of the error value on the order of decimeters 802 is equal to any value between 12 bits and 16 bits.

The augmentation information adjustment unit 102 reduces the satellite clock error, the satellite orbit error, and the inter-frequency bias included in the augmentation information on the order of centimeters selected in S1021 and the bit count of each of the ionospheric delay error and the tropospheric delay error (the ionospheric delay error and the tropospheric delay error corresponding to the grid point filled in with black in FIG. 7) included in the augmentation information on the order of centimeters and selected in S1022.

Note that the augmentation information adjustment unit 102 notifies of the decrease in reliability caused by reducing the bit count in the form of the integrity information to be described later.

Through S1021 to S1023 described above, the amount of information in the augmentation information on the order of centimeters is reduced to be the augmentation information on the order of decimeters.

A bandwidth of 2 Kbps is required to transmit the augmentation information on the order of centimeters, while a bandwidth of 250 bps is sufficient to transmit the augmentation information on the order of decimeters.

As a result, the data volume can be reduced to approximately one eighth by converting the augmentation information on the order of centimeters into the augmentation information on the order of decimeters.

Moreover, the augmentation information adjustment unit 102 uses the reduced bit count and information on the reduced grid point to be able to calculate reliability of the augmentation information when the amount of information therein is reduced, on the basis of reliability of the augmentation information obtained from the augmentation information on the order of centimeters.

The augmentation information adjustment unit 102 can find the reliability of the augmentation information on the order of decimeters by obtaining a root sum square (RSS) of the reliability of the augmentation information on the order of centimeters, the decrease in the reliability caused by the bit reduction, and the decrease in the reliability caused by reducing the grid point.

That is, the augmentation information adjustment unit 102 calculates a root sum square RSS of the error 705 and the error 706 illustrated in FIG. 7 and calculates a root sum square RSS of an error corresponding to the bit count reduced as illustrated in FIG. 8 to find the reliability of the augmentation information on the order of decimeters.

The augmentation information adjustment unit 102 then includes the reliability as the integrity information into the augmentation information.

The augmentation information adjustment unit 102 thus generates the integrity information notifying of the decrease in reliability of the positioning accuracy caused by the geographic interval error value adjustment processing and the bit count adjustment processing and includes the generated integrity information into the augmentation information on the order of decimeters.

The augmentation information output unit 103 transmits the augmentation information including the integrity information.

The integrity information allows a user who uses the augmentation information on the order of decimeters to find reliability of a measurement result on the basis of the augmentation information in real time and is an essential piece of information in controlling a moving body.

*Description of Effect*

According to the present embodiment described above, the augmentation information on the order of centimeters is converted to the augmentation information on the order of decimeters to be able to compress the data volume of the augmentation information down to approximately one eighth and allow the communication bandwidth to be used effectively.

Moreover, as the augmentation information on the order of centimeters requires 2 Kbps to be transmitted, a signal in the L6 frequency band needs to be used when the information is transmitted from the quasi-zenith satellite or the like.

The augmentation information on the order of decimeters can be transmitted at 250 bps so that the L1, L2, or L5 frequency can be used when the information is transmitted from the quasi-zenith satellite or the like.

The smart phone, cellular phone, tablet terminal, and car navigation system generally support the L1, L2, or L5 frequency and can thus realize positioning with relatively high accuracy on the order of decimeters even without a circuit or the like for the L6 frequency.

According to the present embodiment, the information processing device 100 degrades the augmentation information on the order of centimeters so as to generate the augmentation information on the order of decimeters 400. Thus, the amount of information occupied by positioning augmentation information can be reduced for simultaneous distribution of various types of information including the additional information 401 and the miscellaneous information 402. The augmentation information on the order of centimeters in a quasi-zenith satellite of Japan is 2 Kbps. The amount of information is degraded to approximately 250 bps so as to broadcast the augmentation information on the order of decimeters (on the order of 10 cm). Such reduction in the amount of information in the augmentation information makes it possible not only to simultaneously distribute various types of information, but also to reduce communication traffic load in order to use and apply the positioning information and the positioning augmentation information in the boundary area between the indoors and the outdoors even when user accesses are concentrated or when the spread of wearable computers in the future restricts the amount of information that can be handled by an information terminal.

By including various types of positioning information in the additional information 401, a positioning environment is provided between the outdoors and the boundary area. By including security information in the additional information 401, it is possible to prevent the risk of privacy violation caused by leakage of personal information and confidential information or the like and the occurrence of property losses caused by abuse thereof.

By providing the miscellaneous information 402 such as three-dimensional high-accuracy position information, open data, and an application, it is possible to realize application services using high-accuracy positioning information concerning persons and goods, such as "maintenance of a public facility", "autonomous driving", "computer-aided construction and IT agriculture", "sophistication of barrier-free accessibility", "sophisticated routing assistance in tourism", and "evacuation guidance in a disaster".

The first embodiment has described the case in which the augmentation information on the order of decimeters 400 is transmitted from the information processing device 100 to the positioning device 600 via the wireless LAN network 800 and the relay communication equipment 850 and the case in which the augmentation information on the order of decimeters 400 is transmitted from the information processing device 100 to the positioning device 600 via the transmitter 700 and the quasi-zenith satellite 200. However, it may be configured such that the augmentation information on the order of decimeters 400 is received not only by the positioning device 600 used by a user but also by a management center.

By transmitting the augmentation information on the order of decimeters 400 to various management centers, it is possible to use and apply information held by business operators such as a railway operator, a road operator, a local government, a civil engineering operator, a construction operator, a construction machinery operator, an agricultural machinery operator, a surveying operator, a mapping operator, a municipal consulting operator, a pedestrian application operator, and a communication operator, or it is possible to distribute optimal information for specialized user needs in each business area. Moreover, effective means is provided as countermeasures against various complaints expected to occur in response to provision of information. Further, it is possible to construct a billing system for billing when information is distributed from the management center to each business operator.

Examples of usage of the miscellaneous information 402 by the various business operators are as follows, for example.

By using a railway application, the railway operator implements the transmission and reception of railway user information, such as accident and service delay information, between an information terminal serving as the positioning device 600 held by a railway user such as a passenger and the communication device 860 installed in the management center of the railway operator.

By using a road application, the road operator implements the transmission and reception of road user information, such as congestion information and road infrastructure asset management information (tunnel cracking information, etc.), between an information terminal serving as the positioning device 600 held by a road user such as a driver and a communication device installed in the management center of the road operator.

By using a local application, the local government implements the transmission and reception of information for residents, such as disaster prevention and disaster reduction information and local government infrastructure asset management information (hazard map information, etc.), between an information terminal serving as the positioning device 600 held by a resident or the like and the communication device 860 installed in the management center of the local government.

By using a business operator application, each of the civil engineering operator, the construction operator, the construction machinery operator, the agricultural machinery operator, the surveying operator, the mapping operator, the municipal consulting operator and the like implements the transmission and reception of information on each business operator and social infrastructure asset management information (information on deterioration of a facility along a railway, tunnel cracking information, hazard map information, etc.) between an information terminal serving as the positioning device 600 held by each business operator and the communication device 860 installed in the management center of each business operator.

The first embodiment has described the case in which the information processing device 100 generates and transmits the additional information 401, the miscellaneous information 402, and the positioning information 403. However, the management center may be adapted to generate and transmit the additional information 401, the miscellaneous information 402, and the positioning information 403. In this case, the information processing device 100 transmits the augmentation information on the order of decimeters 400 to the management center, and the management center generates the additional information 401, the miscellaneous information 402, the positioning information 403, and the like and transmits them together with the augmentation information on the order of decimeters 400 to the positioning device 600 via a communication line such as the wireless LAN network 800, for example.

When the management center is adapted to generate the additional information 401, the miscellaneous information 402, and the positioning information 403, each of a map information provider, a road operator, a local government and the like can serve as the management center, and each business operator can individually provide map information, road information and the like.

Second Embodiment

There has been described the method of reducing the number of each of the ionospheric delay errors and the tropospheric delay errors in the first embodiment.

In the present embodiment, there will be described a method of generating augmentation information on the order of decimeters without reducing the number of each of the ionospheric delay errors and the tropospheric delay errors.

*Description of Configuration*

In the present embodiment as well, a positioning system has an overall configuration as illustrated in FIG. 1, and an information processing device 100 has an internal configuration as illustrated in FIG. 3.

Note, however, that an operation of an augmentation information adjustment unit 102 differs in the present embodiment.

As geographic interval error value adjustment processing 1022, the augmentation information adjustment unit 102 of the present embodiment analyzes a plurality of geographic interval error values, calculates a coefficient value of a coefficient included in an approximate expression used to calculate an approximate value of the geographic interval error value for each geographic interval, and includes the coefficient value for each geographic interval into augmentation information in place of the plurality of geographic interval error values.

That is, the augmentation information adjustment unit 102 analyzes a plurality of ionospheric delay errors included in augmentation information on the order of centimeters that is selected in S1021 of FIG. 5 and calculates, for each grid point, a coefficient value of a coefficient included in an approximate expression used to calculate an approximate value of the ionospheric delay error at each grid point.

The augmentation information adjustment unit 102 further analyzes a plurality of tropospheric delay errors included in the augmentation information on the order of centimeters that is selected in S1021 and calculates, for each grid point, a coefficient value of a coefficient included in an approximate expression used to calculate an approximate value of the tropospheric delay error at each grid point.

The augmentation information adjustment unit 102 then includes, in place of the ionospheric delay error, the calculated coefficient value for each grid point into the augmentation information on the order of centimeters that is selected in S1021.

Moreover, the augmentation information adjustment unit 102 includes, in place of the tropospheric delay error, the calculated coefficient value for each grid point into the augmentation information on the order of centimeters that is selected in S1021.

Note that in the present embodiment, what is different from the first embodiment will mainly be described.

Matters not described below are the same as those of the first embodiment.

*Description of Operation*

In the present embodiment as well, an operation of the information processing device 100 is as illustrated in FIGS. 4 and 5 except for a point described below.

Processing in S1022 in FIG. 5 is different in the present embodiment.

The operation of the augmentation information adjustment unit 102 according to the present embodiment will be described with reference to FIG. 5.

Processing in S1021 of FIG. 5 is the same as that of the first embodiment.

That is, as illustrated in FIG. 6, the augmentation information adjustment unit 102 selects the augmentation information on the order of centimeters to be subjected to the processing in S1022 from among pieces of augmentation information on the order of centimeters input from an augmentation information generation unit 101.

In S1022, the augmentation information adjustment unit 102 analyzes the plurality of ionospheric delay errors included in the augmentation information on the order of centimeters that is selected in S1021 and calculates, for each grid point, the coefficient value of the coefficient included in the approximate expression used to calculate the approximate value of the ionospheric delay error at each grid point.

The augmentation information adjustment unit 102 further analyzes the plurality of tropospheric delay errors included in the augmentation information on the order of centimeters that is selected in S1021 and calculates, for each grid point, the coefficient value of the coefficient included in the approximate expression used to calculate the approximate value of the tropospheric delay error at each grid point.

The augmentation information adjustment unit 102 then includes the calculated coefficient value for each grid point into the augmentation information on the order of centimeters that is selected in S1021, in place of the ionospheric delay error at each grid point included in the augmentation information on the order of centimeters that is selected in S1021.

Moreover, the augmentation information adjustment unit 102 includes the calculated coefficient value for each grid point into the augmentation information on the order of centimeters that is selected in S1021, in place of the tropospheric delay error at each grid point included in the augmentation information on the order of centimeters that is selected in S1021.

A positioning device 600 is notified of a the approximate expression for each of the ionospheric layer delay error and the tropospheric delay error in advance and applies, to the approximate expression, a coefficient value included in augmentation information on the order of decimeters 400 received from a quasi-zenith satellite 200 or a wireless LAN network 800 to be able to obtain the approximate value of each of the ionospheric delay error and the tropospheric delay error at each grid point.

Figure 9:
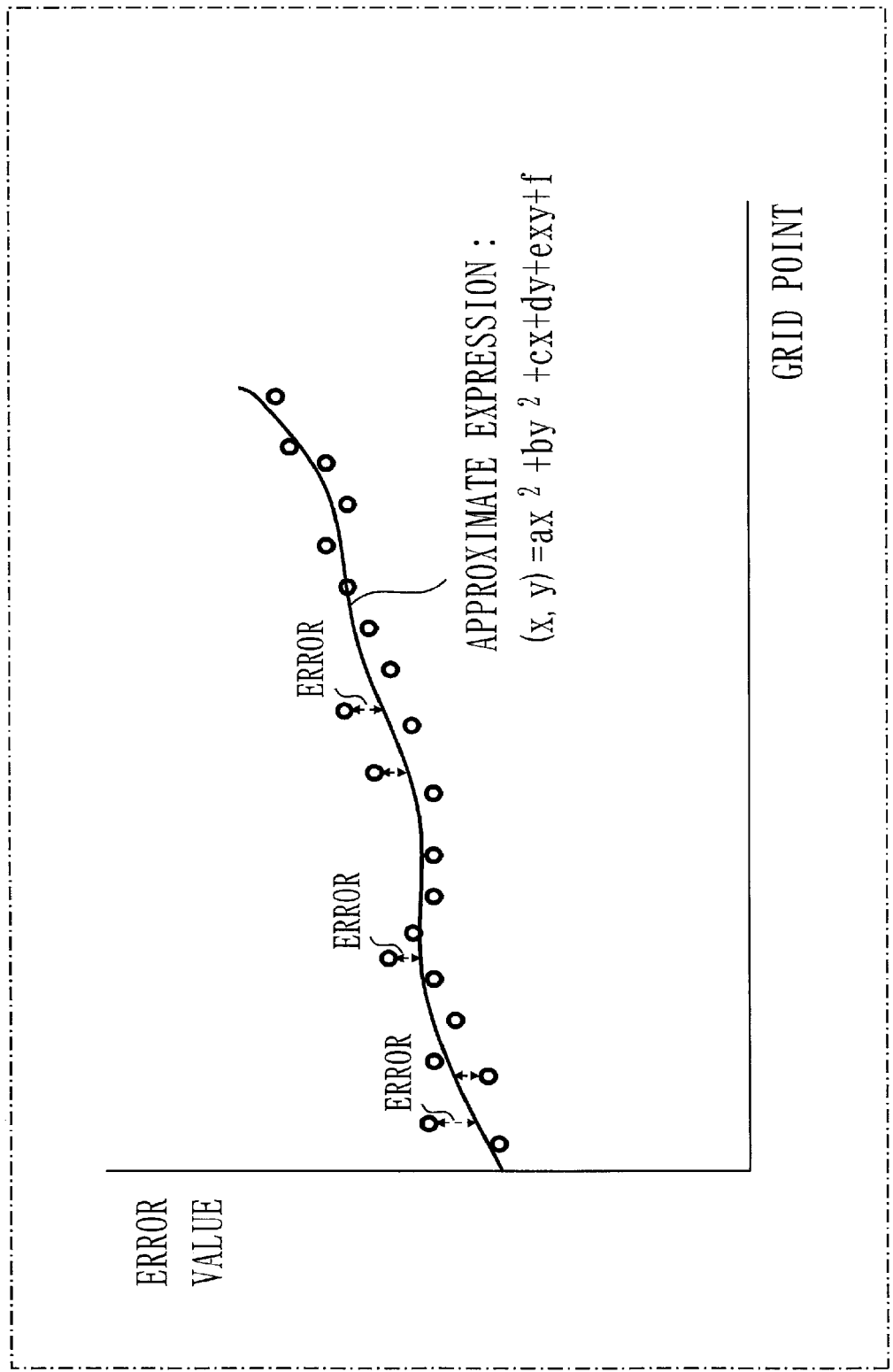
FIG. 9 is a diagram illustrating an example of geographic interval error value adjustment processing according to a second embodiment.

FIG. 9 is a diagram illustrating the operation of the augmentation information adjustment unit 102 according to the present embodiment.

Each circle (○) in FIG. 9 indicates the error value (the ionospheric delay error and the tropospheric delay error) at each grid point.

In the positioning device 600, the approximate value for the error value at each grid point can be calculated using an approximate expression: $(x, y) = ax^2 + by^2 + cx + dy + exy + f$.

In the approximate expression, x denotes a latitude of the position of the grid point, y denotes a longitude of the position of the grid point, each of a, b, c, d, and e denotes the coefficient value calculated for each grid by the augmentation information adjustment unit 102, and f denotes a constant.

Note that while a second-order polynomial is illustrated as an example of the approximate expression, the approximate expression is not limited to a second-order expression.

The augmentation information adjustment unit 102 analyzes the error value for each grid point and calculates the value of each of the coefficients a, b, c, d, and c in the approximate expression by a least squares method, for example.

The augmentation information adjustment unit 102 then includes the value of each of the coefficients a, b, c, d, and e for each grid point into the augmentation information on the order of centimeters that is selected in S1021, in place of the ionospheric delay error at each grid point included in the augmentation information on the order of centimeters that is selected in S1021.

Moreover, the augmentation information adjustment unit 102 includes the value of each of the coefficients a, b, c, d, and e for each grid point into the augmentation information on the order of centimeters that is selected in S1021, in place of the tropospheric delay error at each grid point included in the augmentation information on the order of centimeters that is selected in S1021.

In the positioning device 600, an estimated value of each of the ionospheric delay error and the tropospheric delay error for each grid point can be calculated by the approximate expression. However, there is an error as illustrated in FIG. 9 between the estimated value and each of actual ionospheric delay error and tropospheric delay error.

In FIG. 9, the error is illustrated for only several grid points for the convenience of illustration, but a difference between a graph of the approximate expression and each circle is the error.

The augmentation information adjustment unit 102 notifies of a decrease in reliability caused by using the approximate expression in the form of integrity information to be described later.

Next, in S1023 of FIG. 5, the augmentation information adjustment unit 102 reduces a bit count for each error value included in the augmentation information on the order of centimeters after the processing in S1022.

The processing in S1023 is performed as illustrated in the first embodiment.

Note that the augmentation information adjustment unit 102 does not reduce a bit count of the coefficient value (the value of each of the coefficients a, b, c, d, and e) included in the augmentation information on the order of centimeters in S1022.

Through S1021 to S1023 described above, the amount of information in the augmentation information on the order of centimeters is reduced to be the augmentation information on the order of decimeters.

The conversion into the augmentation information on the order of decimeters by the method according to the present embodiment can also reduce the data volume to approximately one eighth compared to the augmentation information on the order of centimeters.

Moreover, the augmentation information adjustment unit 102 uses the reduced bit count and the approximate expression for the geographic interval error value to be able to calculate reliability of the augmentation information when the amount of information therein is reduced, on the basis of reliability of the augmentation information obtained from the augmentation information on the order of centimeters.

The augmentation information adjustment unit 102 can find the reliability of the augmentation information on the order of decimeters by obtaining a root sum square (RSS) of the reliability of the augmentation information on the order of centimeters, the decrease in the reliability caused by the bit reduction, and the decrease in the reliability caused by using the approximate expression.

That is, the augmentation information adjustment unit 102 calculates a root sum square RSS of each error illustrated in FIG. 9 and calculates a root sum square RSS of an error corresponding to the bit count reduced as illustrated in FIG. 8 to find the reliability of the augmentation information on the order of decimeters.

The augmentation information adjustment unit 102 then includes the reliability as the integrity information into the augmentation information.

The augmentation information adjustment unit 102 thus generates the integrity information notifying of the decrease in reliability of the positioning accuracy caused by the geographic interval error value adjustment processing and the bit count adjustment processing and includes the generated integrity information into the augmentation information on the order of decimeters.

An augmentation information output unit 103 transmits the augmentation information including the integrity information.

The integrity information allows a user who uses the augmentation information on the order of decimeters to find reliability of a measurement result from the augmentation information in real time and is an essential piece of information in controlling a moving body.

*Description of Effect*

According to the present embodiment as well, the augmentation information on the order of centimeters is converted to the augmentation information on the order of decimeters to be able to compress the data volume of the augmentation information down to approximately one eighth and allow a communication bandwidth to be used effectively.

Moreover, a smart phone, a cellular phone, a tablet terminal, a car navigation system or the like can realize positioning with relatively high accuracy on the order of decimeters even without a circuit or the like for an L6 frequency.

Note that while there has been described in the first and second embodiments that the processing of generating the augmentation information on the order of decimeters is performed in the order of the update cycle adjustment processing S1021, the geographic interval error value adjustment processing S1022 and the bit count adjustment processing S1023 as illustrated in FIG. 5, the processing need not be performed in this order but may be performed in a different order such that, for example, the update cycle adjustment processing S1021 is performed after the geographic interval error value adjustment processing S1022, followed by the bit count adjustment processing S1023.

Third Embodiment

A positioning device 600 illustrated in FIG. 1 will be described in detail in the present embodiment.

Note that while there will be described an example in the present embodiment that the positioning device 600 receives augmentation information on the order of decimeters 400 and uses the augmentation information on the order of decimeters 400 to perform satellite positioning, the augmentation information on the order of decimeters 400 may be replaced by augmentation information on the order of centimeters when the augmentation information on the order of centimeters can be received to thus allow the positioning device to perform satellite positioning by using the augmentation information on the order of centimeters.

*Description of Configuration*

Figure 10:
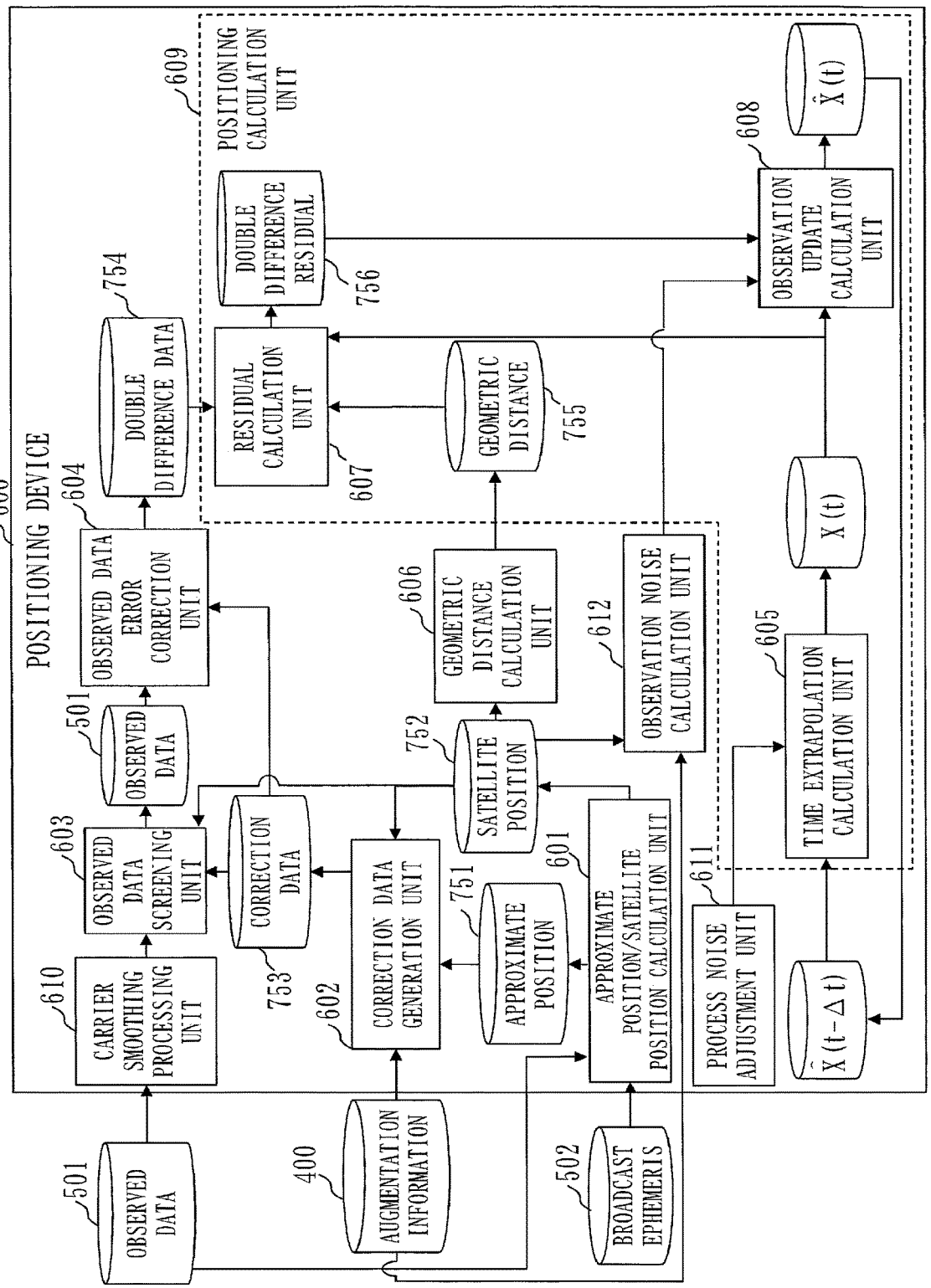
FIG. 10 is a diagram illustrating a configuration example of a positioning device according to a third embodiment.

FIG. 10 illustrates a configuration example of the positioning device 600 according to the present embodiment.

Moreover, FIG. 11 illustrates a brief description of each component illustrated in FIG. 10, and FIG. 12 illustrates a brief description of intermediate data.

An approximate position/satellite position calculation unit 601 receives observed data 501 and a broadcast ephemeris 502 from a GPS satellite 300 and calculates an approximate position of a positioning point and a position of each GPS satellite 300.

An approximate position 751 and a satellite position 752 are calculation results of the approximate position/satellite position calculation unit 601.

The approximate position 751 is a position of the positioning point that is calculated by independent positioning and accurate on the order of meters.

The satellite position 752 is a position of each GPS satellite 300 from which the positioning device 600 receives the observed data.

A correction data generation unit 602 receives the augmentation information on the order of decimeters 400 from a quasi-zenith satellite 200 as well as acquires the approximate position 751 and the satellite position 752 to calculate correction data 753 from the augmentation information on the order of decimeters 400, the approximate position 751 and the satellite position 752.

The correction data 753 indicates an error expected to be included in the observed data 501 that is received at the positioning point from each GPS satellite 300.

An observed data screening unit 603 eliminates the observed data 501 that is expected to be degraded in quality.

More specifically, the observed data screening unit 603 selects the observed data 501 to be used in positioning calculation from among the plurality of pieces of observed data 501 on the basis of an angle of elevation of the GPS satellite 300 being a positioning satellite from which the observed data 501 is transmitted as well as received signal strength of the observed data 501.

The observed data screening unit 603 for example has a threshold table in which a plurality of ranges of the angle of elevation is indicated and, for each range of the angle of elevation, a threshold of the received signal strength is defined.

The observed data screening unit 603 then refers to the threshold table and selects a piece of observed data 501 when the received signal strength of the observed data 501 is higher than or equal to a threshold of the received signal strength defined in association with a range of the angle of elevation corresponding to the angle of elevation of the GPS satellite 300 from which the observed data is transmitted.

An observed data error correction unit 604 performs double difference calculation to output double difference data 754 of the observed data.

The double difference data 754 indicates a value obtained by subtracting observed data of a master satellite (observed data already corrected by using the correction data 753) from observed data of a slave satellite (observed data already corrected by using the correction data 753).

A time extrapolation calculation unit 605 performs time extrapolation calculation to estimate a state quantity X(t) of a current epoch from a state quantity X^(t-Δt) of a previous epoch.

More specifically, the time extrapolation calculation unit 605 estimates the state quantity X(t) by using process noise adjusted by a process noise adjustment unit 611 to be described later.

Note that notation in which "^" lies directly above "X" in FIG. 10 is identical in meaning to the notation in which "^" lies at the upper right of "X" ("X^").

Moreover, "^" indicates a state quantity after being updated by an observation update calculation unit 608 to be described.

Note that the state quantity X(t) corresponds to the position and speed of the positioning device 600.

A geometric distance calculation unit 606 calculates a geometric distance 755 from the GPS satellite 300 to the positioning point on the basis of the satellite position 752.

A residual calculation unit 607 calculates a double difference residual 756 from the double difference data 754 and the geometric distance 755.

The observation update calculation unit 608 updates the state quantity X(t) such that the state quantity X(t) has the smallest estimated error.

More specifically, the observation update calculation unit 608 updates the state quantity X(t) by using observation noise calculated by an observation noise calculation unit 612 to be described later.

The state quantity X(t) after being updated by the observation update calculation unit 608 is denoted as a state quantity XA (t).

Note that a range enclosed with a dashed line in FIG. 10 is called a positioning calculation unit 609.

The positioning calculation unit 609 performs positioning calculation by using the process noise adjusted by the process noise adjustment unit 611 and the observation noise calculated by the observation noise calculation unit 612.

A carrier smoothing processing unit 610 performs carrier smoothing on the observed data 501 (a pseudorange and a carrier phase).

The process noise adjustment unit 611 adjusts the process noise used in the positioning calculation by the positioning calculation unit 609 (more specifically the time extrapolation calculation unit 605) according to the type of a moving body in which the positioning device 600 is arranged.

The process noise adjustment unit 611 selects process noise smaller in the altitude direction than a default value when the moving body in which the positioning device 600 is arranged is any of a vehicle, a train and a ship, for example.

The observation noise calculation unit 612 uses integrity information included in the augmentation information to calculate the observation noise used in the positioning calculation.

The integrity information is a piece of information presenting "credibility" of a positioning signal and is used at the time of determining whether a positioning result can be used safely.

The correction data generation unit 602 and the observation noise calculation unit 612 that receive the augmentation information on the order of decimeters 400, and the approximate position/satellite position calculation unit 601 that receives the broadcast ephemeris 502 each correspond to an example of a receiving unit.

\*\*\*Description of Operation\*\*\*

In the present embodiment, there will be described the operation of mainly the observed data screening unit 603, the time extrapolation calculation unit 605, the observation update calculation unit 608, the process noise adjustment unit 611 and the observation noise calculation unit 612.

The observed data screening unit 603 selects the observed data 501 to be subjected to the processing by the observed data error correction unit 604 and beyond, from among the pieces of the observed data 501 on which the carrier smoothing is already performed by the carrier smoothing processing unit 610.

The observed data screening unit 603 selects the observed data 501 to be subjected to the processing by the observed data error correction unit 604 and beyond from among the plurality of pieces of the observed data 501 on the basis of the angle of elevation of the GPS satellite 300 from which the observed data 501 is transmitted as well as the received signal strength of the observed data 501.

A positioning device has conventionally performed screening on observed data used in positioning calculation on the basis of received signal strength, where there has been uniformly applied a common threshold of the received signal strength regardless of the angle of elevation between the GPS satellite 300 and the positioning device 600.

There is a correlation between the angle of elevation of a satellite and the received signal strength where, in general, the received signal strength of the observed data increases as the angle of elevation of the satellite increases.

When the received signal strength of observed data from a certain GPS satellite 300 largely falls below the received signal strength from another GPS satellite 300 when the another GPS satellite 300 is at an equal angle of elevation, for example, it is presumed that quality of the observed data from the GPS satellite 300 is not very good even when the received signal strength of the GPS satellite 300 exceeds the uniform threshold.

Therefore, in the present embodiment, the observed data screening unit 603 considers the correlation between the angle of elevation between the positioning device 600 and the GPS satellite 300 and the received signal strength of the observed data to select the observed data 501 to be used in the positioning calculation.

The observed data screening unit 603 holds a threshold table illustrated in FIG. 13, for example.

In the threshold table of FIG. 13, a plurality of ranges of the angle of elevation is indicated and, for each range of the angle of elevation, a threshold of the received signal strength is defined.

That is, in FIG. 13, ranges of 10 to 20 degrees and 20 to 30 degrees are described as the ranges of the angle of elevation, for example.

Note that in FIG. 13, the range of 10 to 20 degrees means 10.1 to 20.0 degrees while the range of 20 to 30 degrees means 20.1 to 30.0 degrees.

The threshold table in FIG. 13 is generated by analyzing the correlation between the angle of elevation of the satellite and the received signal strength of the observed data for a plurality of the GPS satellites 300.

The observed data screening unit 603 calculates the angle of elevation of the GPS satellite 300 from which the observed data 501 is transmitted, on the basis of the satellite position 752 calculated by the approximate position/satellite position calculation unit 601.

The observed data screening unit 603 then refers to the threshold table in FIG. 13 and selects the observed data 501 with the received signal strength higher than or equal to a threshold of the received signal strength defined in association with a range of the angle of elevation corresponding to the calculated angle of elevation of the satellite, from among the plurality of pieces of the observed data 501 on which the carrier smoothing is already performed.

The observed data screening unit 603 outputs only the selected observed data 501 to the observed data error correction unit 604.

In order for the positioning calculation unit 609 to perform positioning calculation, the observed data screening unit 603 needs to select four or more of the observed data 501.

Next, there will be described a Kalman filter realizing the time extrapolation calculation unit 605 and the observation update calculation unit 608.

Figure 14:
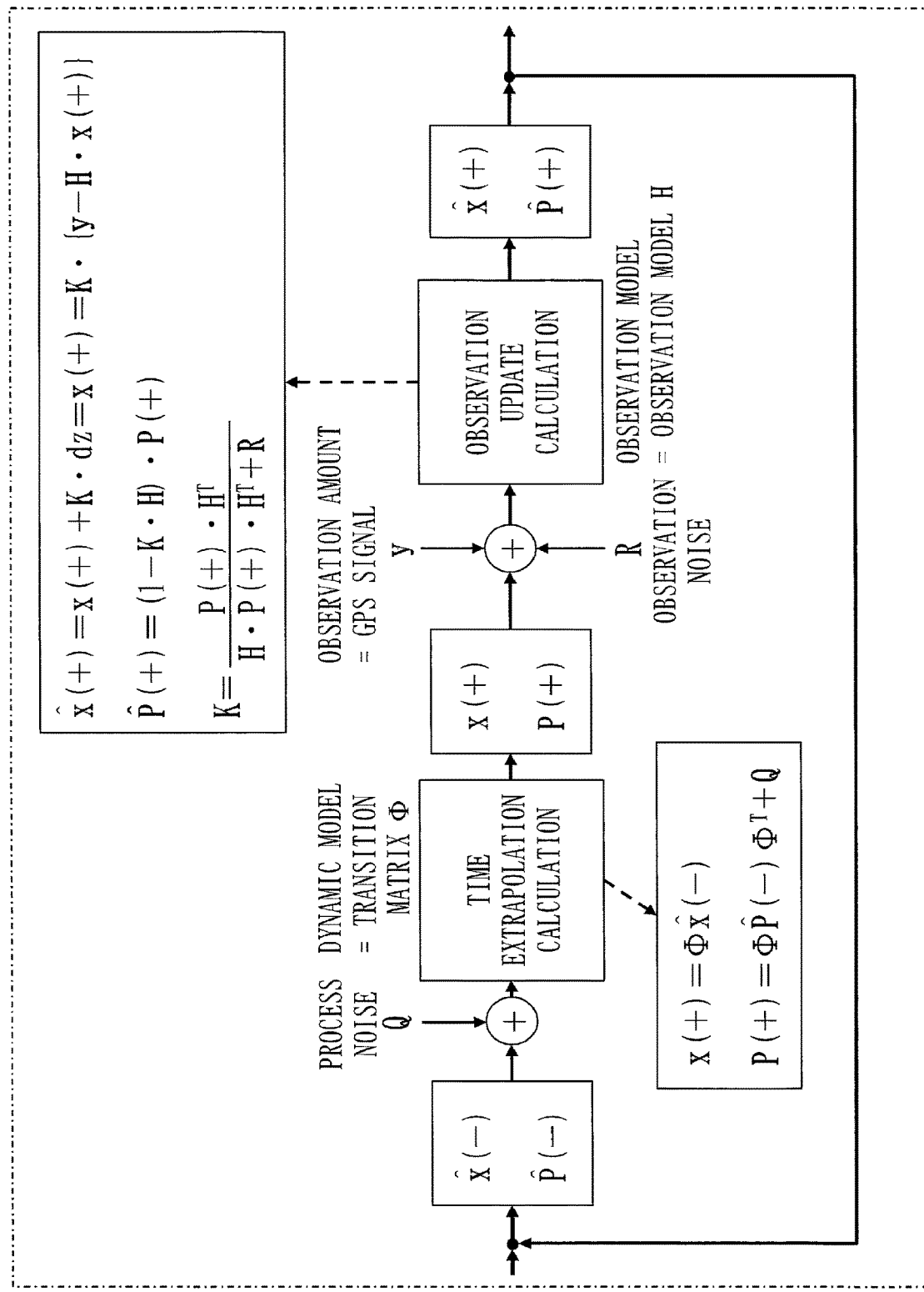
FIG. 14 is a diagram illustrating a processing flow of a Kalman filter according to the third embodiment.

FIG. 14 illustrates a processing flow of the Kalman filter.

FIG. 15 illustrates a description of a variable used in the processing of the Kalman filter.

The time extrapolation calculation unit 605 performs time extrapolation calculation of the Kalman filter illustrated in FIG. 14.

Moreover, the observation update calculation unit 608 performs observation update calculation of the Kalman filter illustrated in FIG. 14.

The time extrapolation calculation and the observation update calculation form a single loop, and the loop formed by the time extrapolation calculation and the observation update calculation is executed repeatedly.

The Kalman filter estimates a state quantity such that a diagonal element of an error variance (error variance matrix $P_{ij}=E<x_i x_j>$, where $E<a>$ is a variance of "a") of the estimated state quantity (state quantity X) is the smallest in each loop being repeated.

Processing performed in the Kalman filter will be described in due order.

In the time extrapolation calculation, from a state quantity $(\hat{x}(-))$ and an error variance matrix $(\hat{P}(-))$ of a previous time, a state quantity $(x(+))$ and an error covariance matrix $(P(+))$ of a following time are estimated based on a transition matrix $\phi$ determined according to a dynamic model being adopted.

At this time, process noise Q that is an error expected between the dynamic model and an actual phenomenon is added to the error covariance matrix $(\hat{P}(-))$.

The process noise Q is also determined according to the dynamic model and design being adopted.

From the estimated state quantity $(x(+))$, an amount $y^-$ equivalent to an observation amount ($y^-$ represents that "−" lies directly above "y"; the same applies hereinafter) is obtained, the amount $y^-$ being estimated by an observation model ($y^- = f(x)$) expressing a relationship between the state quantity and the observation amount.

In the observation update calculation, a residual ($dz=y-y^-$) being a difference between an actual observation amount and the estimated observation amount is obtained and converted into a difference in the state quantity ($dx=K \cdot dz$) by using Kalman gain K expressed in an expression in FIG. 14, whereby the state quantity is updated.

An observation matrix used in the observation update calculation expresses the observation model and is obtained by the following expression.

$$dz = H \cdot dx (dz = y - \bar{y} = f(\hat{x}) - f(x) = \nabla_x f \cdot dx = H \cdot dx) \quad \text{[Expression 1]}$$

Moreover, R included in the denominator of the expression of the Kalman gain K represents observation noise expected to be included in the observation amount.

The process noise adjustment unit 611 adjusts the process noise provided to the time extrapolation calculation unit 605.

Figure 16:
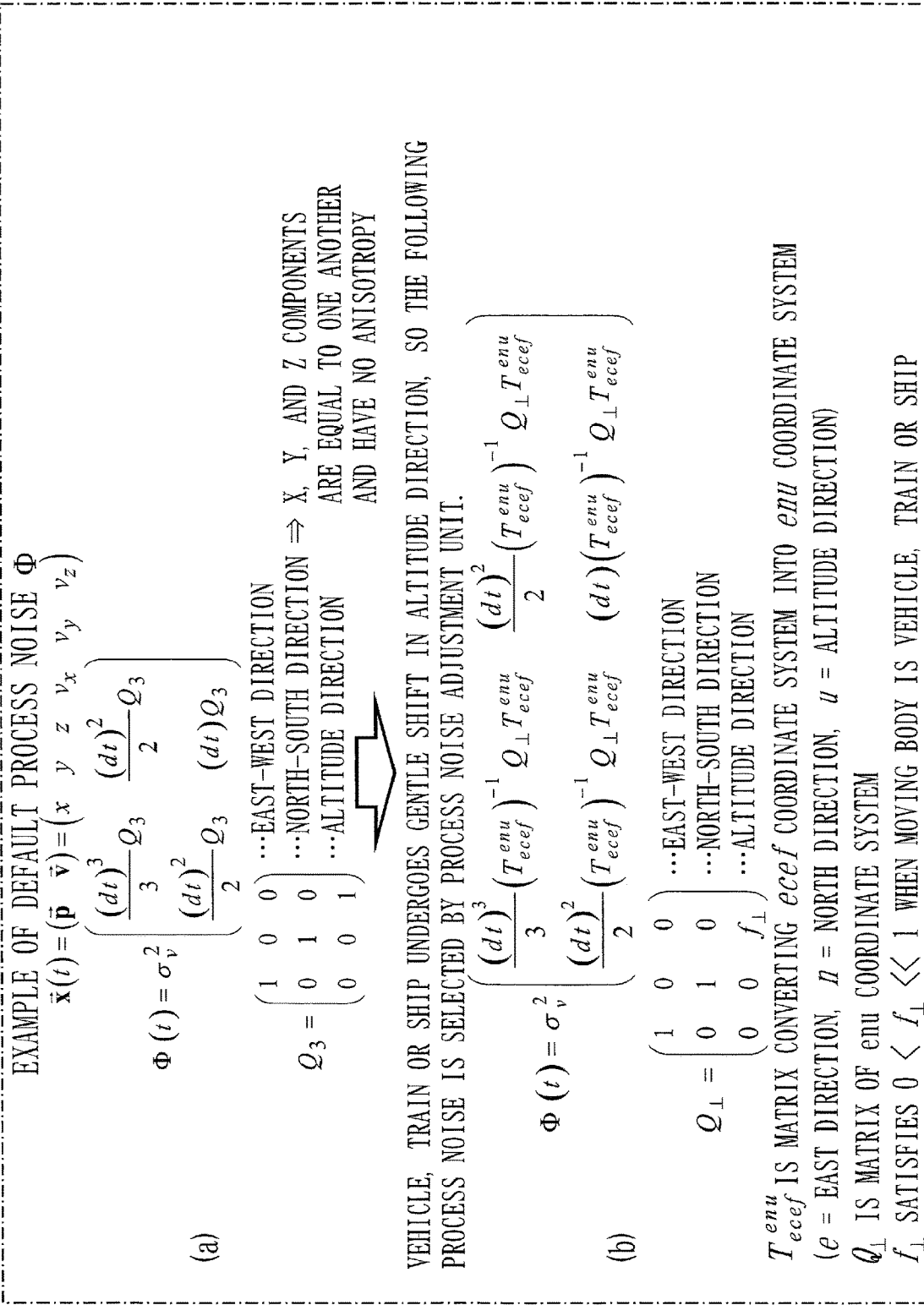
FIG. 16 is a diagram illustrating an operational example of a process noise adjustment unit according to the third embodiment.

FIG. 16 illustrates default process noise and process noise obtained after being adjusted by the process noise adjustment unit 611.

Default process noise $Q_3$ has an X component (east-west direction), a Y component (north-south direction) and a Z component (altitude direction) that are equal to one another with no anisotropy as illustrated in (a) of FIG. 16.

However, a vehicle, train or ship shifts in the altitude direction in a gentle manner.

It is thus desired to set the process noise in the altitude direction smaller than a default value when the vehicle, train or ship is the moving body in which the positioning device 600 is arranged.

Accordingly, in the present embodiment, the process noise adjustment unit 611 selects $f_1 (0<f_1<<1)$ as the value of the process noise in the altitude direction when the moving body is any of the vehicle, train and ship (when the positioning device 600 is mounted in any of the vehicle, train and ship).

The process noise adjustment unit 611 then outputs process noise $Q_1$ including $f_1$ to the time extrapolation calculation unit 605, and the time extrapolation calculation unit 605 uses $Q_1$ to perform the time extrapolation calculation illustrated in FIG. 14.

On the other hand, when the moving body in which the positioning device 600 is arranged is a user (human), namely when the user carrying the positioning device 600 is on the move on foot (when the positioning device 600 is not mounted in the vehicle, train or ship), the process noise adjustment unit 611 outputs the default process noise $Q_3$ to the time extrapolation calculation unit 605, and the time extrapolation calculation unit 605 uses $Q_3$ to perform the time extrapolation calculation illustrated in FIG. 14.

Moreover, when the moving body in which the positioning device 600 is arranged is an airplane, the process noise adjustment unit 611 outputs the default process noise $Q_3$ to the time extrapolation calculation unit 605, and the time extrapolation calculation unit 605 uses $Q_3$ to perform the time extrapolation calculation illustrated in FIG. 14.

Note that the type of the moving body in which the positioning device 600 is arranged is input to the positioning device 600 by the user, for example, the type being the vehicle, train or ship, the user (human), or the airplane.

Moreover, in FIG. 16, $T_{ecef}^{enu}$ is a matrix converting an ecef coordinate system into an enu coordinate system.

Furthermore, each of $Q_3$ and $Q_1$ is a matrix (process noise) in the enu coordinate system, and $f_\perp$ is the value of the process noise in the altitude direction when the moving body is any of the vehicle, train and ship.

The observation noise calculation unit 612 calculates the observation noise provided to the observation update calculation unit 608.

Figure 17:
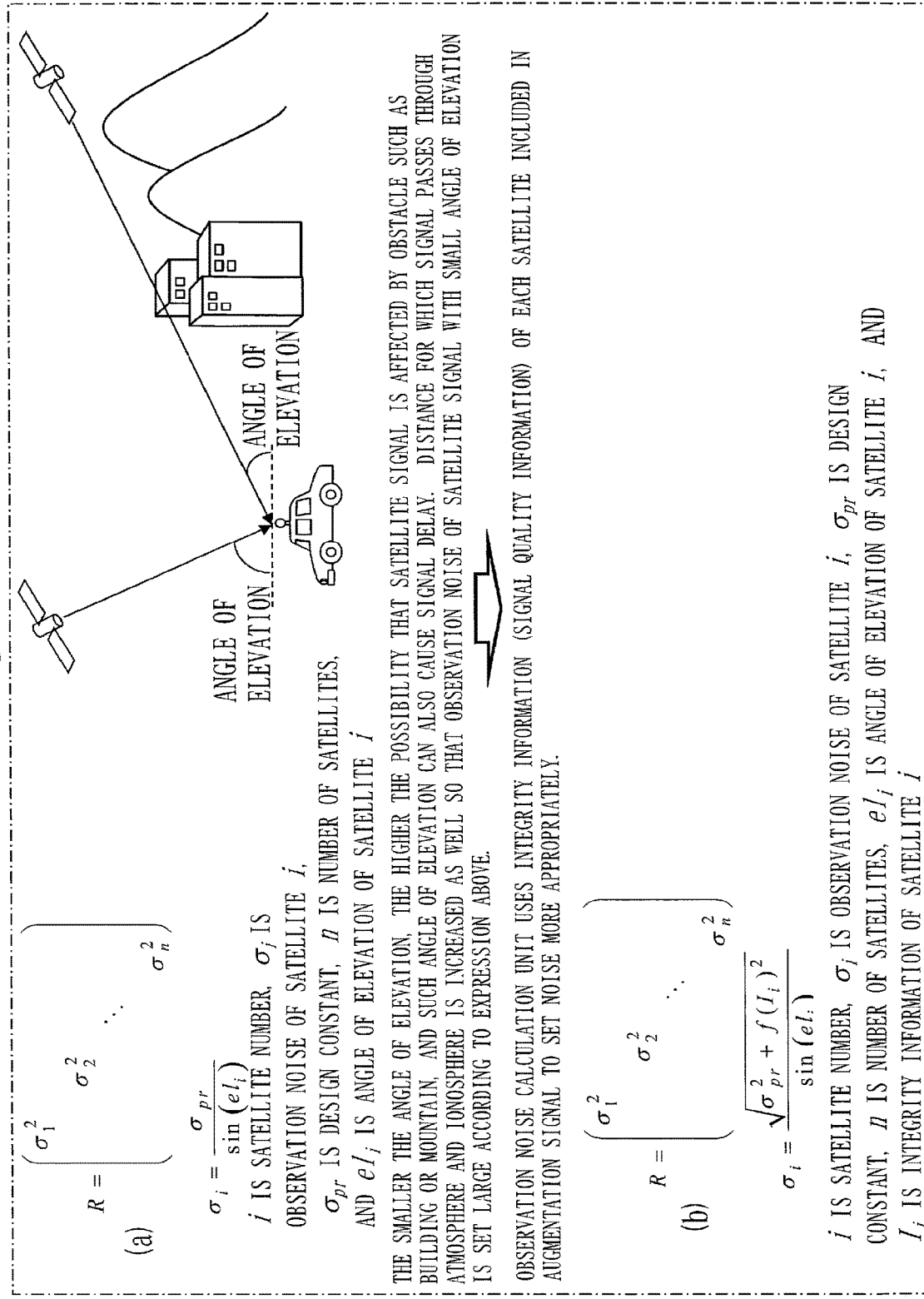
FIG. 17 is a diagram illustrating an operational example of an observation noise calculation unit according to the third embodiment.

FIG. 17 illustrates conventional observation noise and the observation noise calculated by the observation noise calculation unit 612.

The smaller the angle of elevation, the higher the possibility that a satellite signal is affected by an obstacle such as a building or mountain and the longer the distance for which the signal passes through the atmosphere and ionosphere causing a signal delay, so that the observation noise of the satellite signal with the small angle of elevation is conventionally large as illustrated in (a) of FIG. 17.

Low weighting is set to the observed data from a satellite having a large value of the observation noise in the observation update calculation performed by the observation update calculation unit 608 and, as a result, the data is reflected in a measurement result to a small degree.

The augmentation information includes the integrity information.

In the integrity information, a high value is set to observed data from a satellite that is considered low in quality, whereas a low value is set to observed data from a satellite that is considered high in quality.

As described above, the observed data from the satellite with the small angle of elevation is likely to be low in quality so that the observed data from the satellite having the small angle of elevation and considered low in quality is desirably reflected in the positioning result to a small degree.

The observation noise calculation unit 612 according to the present embodiment uses the integrity information in calculating the observation noise to set the observation noise more properly.

More specifically, as illustrated in (b) of FIG. 17, the observation noise calculation unit 612 reflects the value of the integrity information of a target GPS satellite 300 in a formula of the observation noise.

The observation noise calculation unit 612 outputs observation noise R being a matrix of observation noise $\sigma_i$ calculated by the formula illustrated in (b) of FIG. 17 to the observation update calculation unit 608, and the observation update calculation unit 608 uses the observation noise R to perform the observation update calculation illustrated in FIG. 14.

Note that in FIG. 17, i denotes a satellite number, $\sigma_i$ denotes the observation noise of a satellite i, and $\sigma_{pr}$ denotes a design constant.

Moreover, n denotes the number of satellites captured by the positioning device 600, and $el_i$ denotes the angle of elevation of the satellite i.

Furthermore, $I_i$ denotes the integrity information of the satellite i.

The observation noise calculation unit 612 calculates the angle of elevation of the satellite i on the basis of the satellite position 752 calculated by the approximate position/satellite position calculation unit 601.
*Description of Effect*

Therefore, according to the present embodiment, the observed data screening unit 603 selects the observed data used in the positioning calculation while considering the angle of elevation of the satellite, whereby the observed data with good quality can be selected more accurately.

Moreover, according to the present embodiment, the process noise adjustment unit 611 selects the process noise according to the type of the moving body, whereby the positioning accuracy can be improved by using the process noise appropriate for the type of the moving body.

Furthermore, according to the present embodiment, the observation noise calculation unit 612 uses the integrity information to calculate the observation noise, whereby the positioning accuracy can be improved by increasing the weighting on the observed data with high quality and decreasing the weighting on the observed data with low quality.

These effects can then compensate for a decrease in the positioning accuracy caused by the use of the augmentation information on the order of decimeters.

Fourth Embodiment

Another embodiment of a positioning device 600 will be described in the present embodiment.
*Description of Configuration*

In the present embodiment as well, an example of the configuration of the positioning device 600 is as illustrated in FIG. 10.

However, in the present embodiment, when n (n≥5) pieces of observed data is selected on the basis of an angle of elevation of a satellite and received signal strength, an observed data screening unit 603 repeats an operation of selecting m (m≥4 and m<n) pieces of observed data from among the n pieces of observed data. The observed data screening unit 603 then generates k (k≥4 and k≤n) data sets, each of which is a data set composed of the m pieces of observed data and has a different combination of the m pieces of observed data.

Moreover, in the present embodiment, an observation update calculation unit 608 of a positioning calculation unit 609 performs observation update calculation on the m pieces of observed data making up the data set for each data set, and selects any data set from among the k data sets on the basis of a variance of a residual (double difference residual) before the observation update calculation of each data set and a variance of a residual (double difference residual) after the observation update calculation of each data set.

More specifically, the observation update calculation unit 608 extracts a data set having the smallest variance of the residual after the observation update calculation, and compares the variance of the residual after the observation update calculation of the extracted data set with a variance of a residual after update calculation of a data set having the second smallest variance of a residual after the observation update calculation.

When there is a significant difference between the variances, the observation update calculation unit 608 determines whether or not a variance of a residual before the observation update calculation of the extracted data set is equal to or smaller than a threshold, and selects the extracted data set when the variance of the residual before the observation update calculation of the extracted data set is equal to or smaller than the threshold.

The observation update calculation unit 608 then handles the residual (double difference residual) in the selected extracted data set as a state quantity $\hat{X}(t)$.

An operation of each of a process noise adjustment unit 611 and an observation noise calculation unit 612 is the same as that described in the third embodiment.

Moreover, in the third embodiment, an approximate position/satellite position calculation unit 601, a correction data generation unit 602, an observed data error correction unit 604, a time extrapolation calculation unit 605, a geometric distance calculation unit 606 and a residual calculation unit 607 perform processing on the four or more pieces of observed data selected by the observed data screening unit 603 whereas, in the present embodiment, the k data sets each composed of the m pieces of observed data is subjected to the processing.

However, except for the k data sets being subjected to the processing, an operation of each of the approximate position/satellite position calculation unit 601, the correction data generation unit 602, the observed data error correction unit 604, the time extrapolation calculation unit 605, the geometric distance calculation unit 606 and the residual calculation unit 607 is the same as that illustrated in the third embodiment.

That is, each of the approximate position/satellite position calculation unit 601, the correction data generation unit 602, the observed data error correction unit 604, the time extrapolation calculation unit 605, the geometric distance calculation unit 606 and the residual calculation unit 607 performs processing identical to that of the third embodiment on each data set.

*Description of Operation*

Next, an example of the operation of the positioning device 600 according to the present embodiment will be described with reference to FIG. 18.

Since the operation of each of the observed data screening unit 603 and the observation update calculation unit 608 of the present embodiment is different from that of the third embodiment, there will be described an example of the operation of mainly the observed data screening unit 603 and the observation update calculation unit 608.

Figure 18:
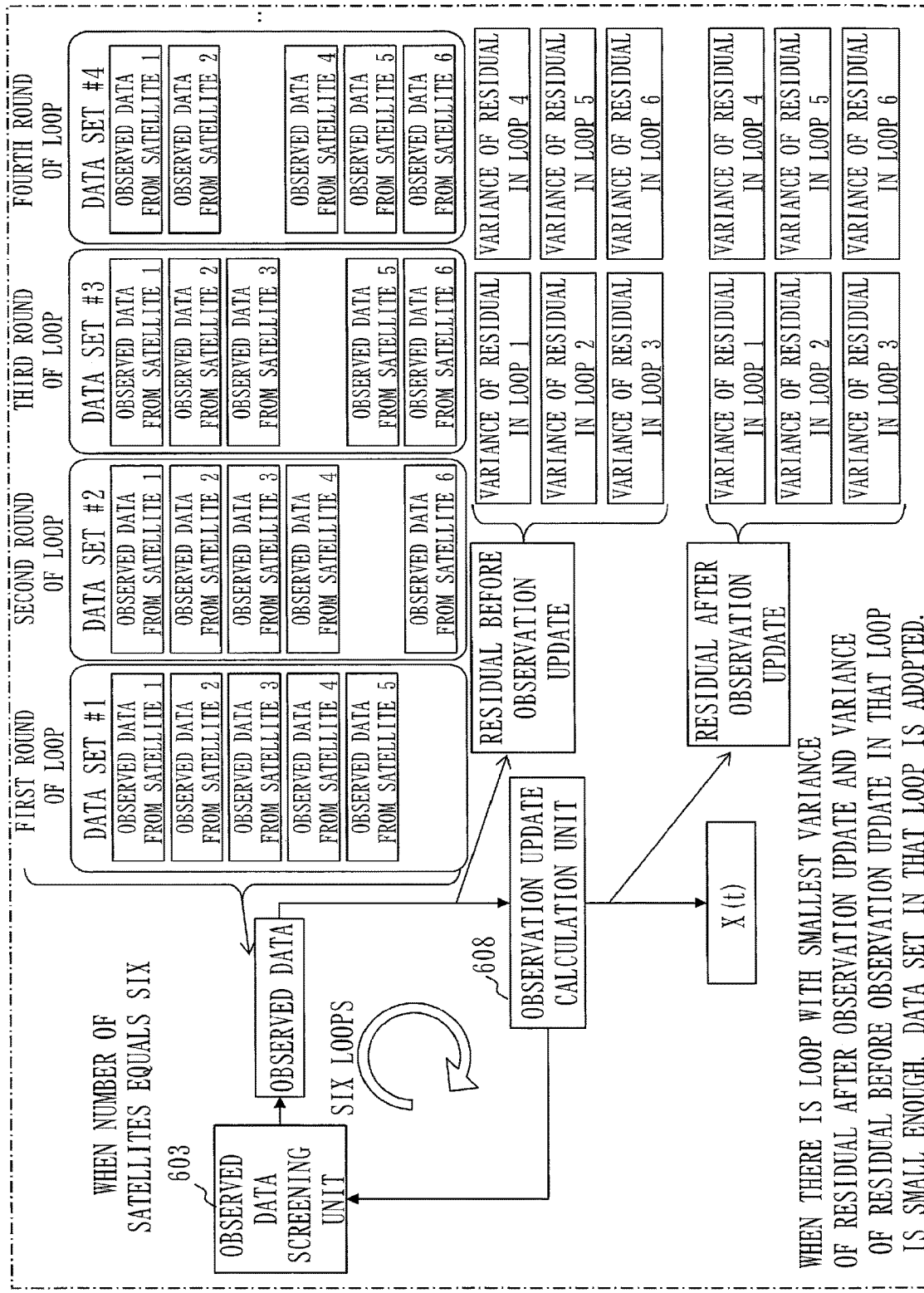
FIG. 18 is a diagram illustrating an operational example of an observation update calculation unit according to a fourth embodiment.

FIG. 18 illustrates an example where n=6, m=5, and k=6.

That is, FIG. 18 illustrates an example where the observed data screening unit 603 selects six pieces of observed data from six GPS satellites 300 on the basis of the angle of elevation of the satellite and the received signal strength.

The observed data screening unit 603 generates a data set by selecting five pieces of observed data from among the six pieces of observed data.

Here, the data set generated first is referred to as a data set #1.

In the example of FIG. 18, the data set #1 is formed of observed data from satellite 1, observed data from satellite 2, observed data from satellite 3, observed data from satellite 4, and observed data from satellite 5.

The observed data screening unit 603 outputs the generated data set #1 to the observed data error correction unit 604.

The observed data error correction unit 604 performs double difference calculation on the data set #1 as with the third embodiment and generates double difference data 754.

Moreover, the residual calculation unit 607 calculates a double difference residual 756 as with the third embodiment on the basis of the double difference data 754 generated from the data set #1 and a geometric distance 755.

The observation update calculation unit 608 performs the observation update calculation on the double difference residual 756 for the data set #1.

The observation update calculation unit 608 further calculates a variance of the double difference residual 756 before the observation update calculation for the data set #1 and a variance of the double difference residual 756 after the observation update calculation for the data set #1.

The processing performed up to this point corresponds to a first round of loop.

Next, as processing performed in a second round of loop, the observed data screening unit 603 generates a new data set by selecting five pieces of observed data with a combination different from that of the data set #1, from among the six pieces of observed data.

Here, the data set generated in the second round of loop is referred to as a data set #2.

In the example of FIG. 18, the data set #2 is formed of the observed data from satellite 1, the observed data from satellite 2, the observed data from satellite 3, the observed data from satellite 4, and observed data from satellite 6.

The processing identical to that performed on the data set #1 is performed on the data set #2. The observation update calculation unit 608 calculates a variance of the double difference residual 756 before the observation update calculation for the data set #2 and a variance of the double difference residual 756 after the observation update calculation for the data set #2.

The processing performed up to this point corresponds to the second round of loop.

Likewise, processing from a third round of loop to a sixth round of loop is performed from then on such that the observed data screening unit 603 generates data sets #3 to #6 while the observation update calculation unit 608 calculates a variance of the double difference residual 756 before the observation update calculation and a variance of the double difference residual 756 after the observation update calculation with respect to each of the data sets #3 to #6.

Although the data sets #5 and #6 are omitted from FIG. 18 due to a restriction on drawing space, the data set #5 is formed of the observed data from satellite 1, the observed data from satellite 3, the observed data from satellite 4, the observed data from satellite 5, and the observed data from satellite 6 while the data set #6 is formed of the observed data from satellite 2, the observed data from satellite 3, the observed data from satellite 4, the observed data from satellite 5, and the observed data from satellite 6.

Moreover, in FIG. 18, a residual before observation update means a double difference residual before the observation update calculation is performed by the observation update calculation unit 608 while a residual after observation update means a double difference residual after the observation update calculation is performed by the observation update calculation unit 608.

Furthermore, in each of the residual before observation update and the residual after observation update, a variance of a residual in loop 1 corresponds to the variance of the residual in the data set #1.

The same applies to loop 2 and onward.

Once the processing on the sixth round of loop is completed with the variance of the residual in each of loop 1 to loop 6 obtained for both before and after the observation update, the observation update calculation unit 608 extracts a data set with the smallest variance after the observation update and a data set with the second smallest variance.

Here, it is assumed that the variance of the data set #2 is the smallest and that the variance of the data set #3 is the second smallest.

The observation update calculation unit 608 determines whether or not there is a significant difference between the variance of the data set #2 and the variance of the data set #3.

There may be prepared, for example, a threshold for the difference in the variance (a difference threshold) so that the observation update calculation unit 608 determines there is the significant difference when the difference between the variance of the data set #2 and the variance of the data set #3 exceeds the difference threshold.

When there is the significant difference between the variance of the data set #2 and the variance of the data set #3, the observation update calculation unit 608 determines whether or not the variance before the observation update of the data set #2 is small enough.

There may be prepared, for example, a threshold for the variance before the observation update (a variance threshold before observation update), so that the observation update calculation unit 608 determines the variance before the observation update is small enough when the variance before the observation update of the data set #2 is smaller than or equal to the variance threshold before observation update.

When the variance before the observation update is small enough, the observation update calculation unit 608 selects the data set #2 and handles the double difference residual 756 after the observation update of the data set #2 as the state quantity Xˆ(t) in FIG. 10.

*Description of Effect*

Therefore, according to the present embodiment, there can be obtained the combination of the observed data with which a more accurate positioning result can be obtained.

Note that while the operation of each of the process noise adjustment unit 611 and the observation noise calculation unit 612 is the same as that of the third embodiment, the operation of each of the process noise adjustment unit 611 and the observation noise calculation unit 612 need not be the same as that of the third embodiment.

That is, the process noise adjustment unit 611 may be adapted to output default process noise $Q_3$ illustrated in (a) of FIG. 16 to the time extrapolation calculation unit 605 regardless of the type of a moving body in which the positioning device 600 is arranged.

Moreover, the observation noise calculation unit 612 may be adapted to calculate observation noise $\sigma_i$ according to the expression illustrated in (a) of FIG. 17 without using integrity information.

Furthermore, while the observed data screening unit 603 described above selects the n pieces of observed data by using the threshold of the received signal strength for each angle of elevation of a satellite as with the third embodiment, the n pieces of observed data may be selected by using a uniform threshold for the received signal strength not involving the angle of elevation of a satellite.

Moreover, while there has been described in the third and fourth embodiments the example of operation of the positioning device 600 that receives the augmentation information on the order of decimeters 400, a positioning device receiving augmentation information on the order of centimeters may be adapted to perform the same operation.

That is, the positioning device receiving the augmentation information on the order of centimeters may select observed data to be used in positioning calculation from among a plurality of pieces of observed data on the basis of the angle of elevation of a satellite and the received signal strength of the observed data.

The integrity information included in the augmentation information on the order of centimeters may also be used to calculate the observation noise.

The positioning device receiving the augmentation information on the order of centimeters may also be adapted to adjust the process noise according to the type of the moving body.

Moreover, the positioning device receiving the augmentation information on the order of centimeters may be adapted to generate k data sets from the n pieces of observed data and select any data set from among the k data sets on the basis of a variance of a residual before the observation update calculation of each data set and a variance of a residual after the observation update calculation of each data set.

Furthermore, while there has been described in the third and fourth embodiments the example where the positioning device 600 receives the augmentation information on the order of decimeters 400 from the quasi-zenith satellite 200, the augmentation information on the order of decimeters 400 may be received from a satellite other than the quasi-zenith satellite 200 or from the wireless LAN network 800 providing a wireless LAN environment.

Specifically, where the positioning device 600 receives the augmentation information on the order of decimeters 400 from a satellite other than the quasi-zenith satellite 200, the positioning device 600 may include a receiver used to receive a signal from the satellite and input, to the correction data generation unit 602, the augmentation information on the order of decimeters 400 received by the receiver.

Alternatively, where the positioning device 600 receives the augmentation information on the order of decimeters 400 from the wireless LAN network 800, the positioning device 600 may include a wireless LAN receiver and input, to the correction data generation unit 602, the augmentation information on the order of decimeters 400 received by the wireless LAN receiver.

Lastly, an example of a hardware configuration of each of the information processing device 100 and the positioning device 600 according to the first to fourth embodiments will be described with reference to FIG. 19.

Each of the information processing device 100 and the positioning device 600 is a computer that can implement each component in each of the information processing device 100 and the positioning device 600 by a program.

Each of the information processing device 100 and the positioning device 600 has the hardware configuration in which an arithmetic unit 901, an external storage 902, a main storage 903, a communication unit 904 and an input/output unit 905 are connected to a bus.

The arithmetic unit 901 is a CPU (Central Processing Unit) executing the program.

The external storage 902 is a ROM (Read Only Memory), a flash memory and/or a hard disk device, for example.

The main storage 903 is a RAM (Random Access Memory).

In the positioning device 600, the communication unit 904 receives the observed data and the broadcast ephemeris from the GPS satellite and receives the augmentation information from the quasi-zenith satellite or the wireless LAN network.

Moreover, the communication unit 904 in the positioning device 600 includes an AD (analog-digital) conversion function.

The input/output unit 905 is a touch panel display, for example.

The program usually stored in the external storage 902 is sequentially read into the arithmetic unit 901 and executed while loaded to the main storage 903.

The program is a program implementing the function that is described as " . . . unit" in FIGS. 3 and 10.

Moreover, the external storage 902 stores an operating system (OS), at least a part of which is loaded to the main storage 903 so that the arithmetic unit 901 executes the program implementing the function of the " . . . unit" illustrated in FIGS. 3 and 10 while executing the OS.

Furthermore, the main storage 903 stores as a file a piece of information, data, a signal value and a variable value representing the result of the processing described as "correction of . . . ", "generation of . . . ", "creation of . . . ", "computation of . . . ", "calculation of . . . ", "adjustment of . . . ", "determination of . . . ", "evaluation of . . . ", "update of . . . ", "estimation of . . . ", "extraction of . . . ", "selection of . . . ", "reception of . . . " and the like in the first to fourth embodiments.

Figure 19:
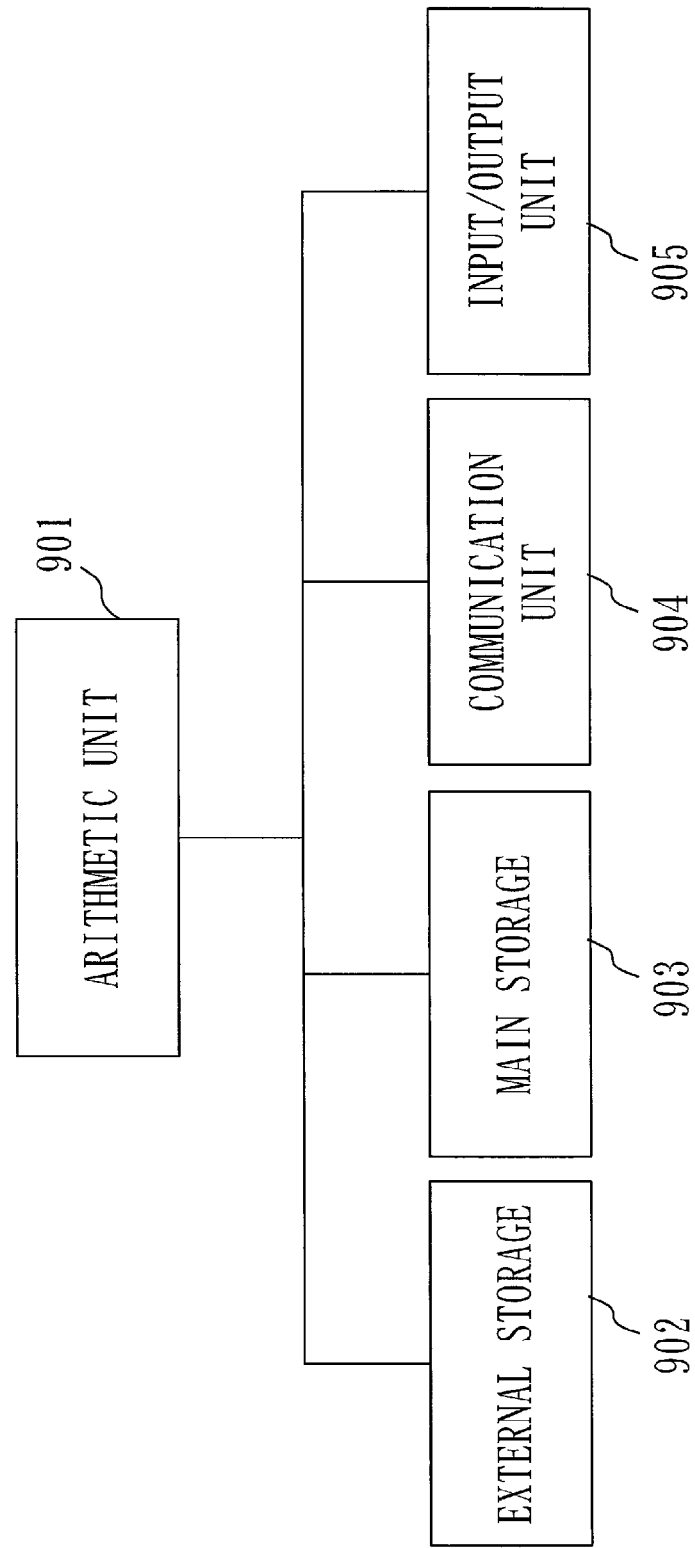
FIG. 19 is a diagram illustrating an example of a hardware configuration of the information processing device and the positioning device according to the first to fourth embodiments.

Note that the configuration in FIG. 19 merely illustrates an example of the hardware configuration of each of the information processing device 100 and the positioning device 600, and the information processing device 100 and the positioning device 600 may thus have the hardware configuration that is not necessarily the configuration illustrated in FIG. 19 but another configuration.

While the embodiments of the present invention have been described, two or more of those embodiments may be combined and implemented.

Alternatively, one of those embodiments may be partially implemented.

Yet alternatively, two or more of those embodiments may be partially combined and implemented.

Note that the present invention is not to be limited by those embodiments but can be modified in various manners as needed.

REFERENCE SIGNS LIST

100: information processing device, 101: augmentation information generation unit, 102: augmentation information adjustment unit, 103: augmentation information output unit, 150: information generation/output unit, 151: additional information processing unit, 152: miscellaneous information processing unit, 153: positioning information processing unit, 200: quasi-zenith satellite, 300: GPS satellite, 400: augmentation information on the order of decimeters, 401: additional information, 402: miscellaneous information, 403: positioning information, 500: positioning signal, 600: positioning device, 601: approximate position/satellite position calculation unit, 602: correction data generation unit, 603: observed data screening unit, 604: observed data error correction unit, 605: time extrapolation calculation unit, 606: geometric distance calculation unit, 607: residual calculation unit, 608: observation update calculation unit, 609: positioning calculation unit, 610: carrier smoothing processing unit, 611: process noise adjustment unit, 612: observation noise calculation unit, 700: transmitter, 800: wireless LAN network, 850: relay communication equipment, 860: communication device, 1000: indoors, 1001: boundary area, 1002: outdoors, 1021: update cycle adjustment processing, 1022: geographic interval error value adjustment processing, 1023: bit count adjustment processing

The invention claimed is:

1. An information processing device comprising:
processing circuitry configured to:
degrade, according to a communication channel, augmentation information with which a positioning error on an order of centimeters is realized and which is updated in a predetermined update cycle, includes a plurality of error values, and is used to correct a satellite positioning error into augmentation information with which a positioning error on an order of decimeters is realized; and
output the augmentation information after being degraded to the communication channel to a positioning device.

2. The information processing device according to claim 1, wherein the processing circuitry outputs additional information used in satellite positioning in addition to the augmentation information.

3. The information processing device according to claim 2, wherein the additional information includes one or more pieces of information of ephemeris information, availability, integrity, and continuity.

4. The information processing device according to claim 2, wherein the additional information includes information used for one or more of authentication, privacy protection, and user management.

5. The information processing device according to claim 2, wherein the processing circuitry further outputs miscellaneous information concerning a user application in a positioning device.

6. The information processing device according to claim 5, wherein the miscellaneous information includes one or more pieces of information of point cloud data, three-dimensional high-accuracy position information including feature data, information concerning a public institution, an application used in the positioning device, and information related to positioning accuracy status at a predetermined position.

7. The information processing device according to claim 1, wherein the processing circuitry degrades the augmentation information with which the position error on the order of centimeters is realized into the augmentation information with which the positioning error on the order of decimeters is realized by combining:
update cycle adjustment processing to set an update cycle of the augmentation information with which the positioning error on the order of centimeters is realized to be an integer multiple of the predetermined update cycle;
geographic interval error value adjustment processing to select, from among a plurality of geographic interval error values each of which is an error at every predetermined geographic interval out of the plurality of error values, a geographic interval error value for each geographic interval being an integer multiple of the predetermined geographic interval, so as to reduce the number of the geographic interval error values; and
bit count adjustment processing to reduce a bit count of the error value for each error.

8. The information processing device according to claim 1, wherein the processing circuitry degrades the augmentation information with which the positioning error on the order of centimeters is realized into the augmentation information with which the positioning error on the order of decimeters is realized by combining:
update cycle adjustment processing to set an update cycle of the augmentation information with which the positioning error on the order of centimeters is realized to be an integer multiple of the predetermined update cycle;

geographic interval error value adjustment processing to analyze a plurality of geographic interval error values each of which is an error at every predetermined geographic interval out of the plurality of error values, calculate, for each geographic interval, a coefficient value of a coefficient included in an approximate expression used to calculate an approximate value of each geographic interval error value, and include the coefficient value for each geographic interval in the augmentation information in place of the plurality of the geographic interval error values; and bit count adjustment processing to reduce a bit count of the error value for each error.

9. A positioning device to receive a plurality of pieces of observed data that are transmitted from a plurality of positioning satellites, the positioning device comprising:

processing circuitry to:

receive augmentation information which is used to correct a satellite positioning error and with which a positioning error on an order of centimeters degraded to augmentation information used to correct a positioning error on an order of decimeters is realized and additional information, in addition to the augmentation information, which is used, together with the augmentation information, in satellite positioning; and perform positioning calculation using the observed data, the augmentation information, and the additional information that have been received.

10. The positioning device according to claim 9, wherein the processing circuitry selects observed data used in the positioning calculation from among the plurality of pieces of observed data, on a basis of an angle of elevation of each positioning satellite that has transmitted each of the plurality of pieces of observed data as well as a received signal strength of each of the plurality of pieces of observed data, and performs the positioning calculation using the observed data selected.

11. The positioning device according to claim 9, wherein the processing circuitry calculates observation noise used in the positioning calculation by using integrity information included in the augmentation information for correcting the satellite positioning error; and performs the positioning calculation by using the observation noise calculated.

12. The positioning device according to claim 9, wherein the processing circuitry repeats an operation of selecting m (m≥4 and m<n) pieces of observed data from among n (n≥5) pieces of observed data transmitted from the positioning satellites, and generate k (k≥4 and k≤n) data sets each of which is formed of the m pieces of observed data and has a different combination of the m pieces of observed data; and performs, for each data set, observation update calculation on the m pieces of observed data making up the data set as a part of the positioning calculation, and select a data set from among the k data sets on a basis of a variance of a residual before the observation update calculation of each data set and a variance of a residual after the observation update calculation of each data set.

* * * * *